(12) United States Patent
Pushkarsky et al.

(10) Patent No.: US 9,093,813 B2
(45) Date of Patent: Jul. 28, 2015

(54) MOUNTING BASE FOR A LASER SYSTEM

(71) Applicant: DAYLIGHT SOLUTIONS, INC., San Diego, CA (US)

(72) Inventors: Michael Pushkarsky, San Diego, CA (US); David F. Arnone, Mountain View, CA (US)

(73) Assignee: DAYLIGHT SOLUTIONS, INC., San Diego, CA (US)

( * ) Notice: Subject to any disclaimer, the term of this patent is extended or adjusted under 35 U.S.C. 154(b) by 216 days.

(21) Appl. No.: 13/649,914

(22) Filed: Oct. 11, 2012

(65) Prior Publication Data
US 2013/0089114 A1  Apr. 11, 2013

Related U.S. Application Data

(60) Provisional application No. 61/545,931, filed on Oct. 11, 2011.

(51) Int. Cl.
*H01S 5/024* (2006.01)
*H01S 5/14* (2006.01)
*H01S 5/34* (2006.01)
*B82Y 20/00* (2011.01)
*H01S 5/00* (2006.01)

(52) U.S. Cl.
CPC ............ *H01S 5/02407* (2013.01); *B82Y 20/00* (2013.01); *H01S 5/141* (2013.01); *H01S 5/3402* (2013.01); *H01S 5/0071* (2013.01)

(58) Field of Classification Search
CPC ... H01S 5/3402; H01S 5/141; H01S 5/02407; H01S 5/0071
USPC .......................................................... 372/34
See application file for complete search history.

(56) References Cited

U.S. PATENT DOCUMENTS

| | | | |
|---|---|---|---|
| 4,737,028 A | 4/1988 | Smith | |
| 4,796,266 A | 1/1989 | Banwell et al. | |
| 5,082,799 A | 1/1992 | Holmstrom et al. | |
| 5,216,544 A * | 6/1993 | Horikawa et al. | 359/622 |
| 5,315,436 A | 5/1994 | Lowenhar | |
| 5,751,830 A | 5/1998 | Hutchinson | |
| 5,901,168 A | 5/1999 | Baillargeon et al. | |
| 6,134,257 A | 10/2000 | Capasso et al. | |
| 6,326,646 B1 | 12/2001 | Baillargeon et al. | |
| 6,400,744 B1 | 6/2002 | Capasso et al. | |
| 6,470,036 B1 | 10/2002 | Bailey et al. | |
| 6,553,045 B2 | 4/2003 | Kaspi | |
| 6,575,641 B2 | 6/2003 | Yamabayashi et al. | |
| 6,636,539 B2 | 10/2003 | Martinsen | |
| 6,690,472 B2 | 2/2004 | Kulp et al. | |
| 6,803,577 B2 | 10/2004 | Edner et al. | |

(Continued)

*Primary Examiner* — Xinning Niu
(74) *Attorney, Agent, or Firm* — Roeder & Broder LLP

(57) ABSTRACT

A laser source assembly (10) comprises a laser system (228), a mounting base (226), and a temperature control system (229). The mounting base (226) supports the laser system (228). The mounting base (226) includes a side wall (232) having a side top (232T) and a side bottom (232B), and a base floor (234) that extends away from the side wall (232) between the side top (232T) and the side bottom (232B). The temperature control system (229) controls the temperature of the laser system (228) and/or the mounting base (226). The temperature control system (229) includes a heat transferor (246) positioned substantially adjacent to an outer surface (2320) of the side wall (232). Heat generated by the laser system (228) is transferred away from the base floor (234) and through the side wall (232) to the heat transferor (246).

24 Claims, 10 Drawing Sheets

(56) References Cited

U.S. PATENT DOCUMENTS

| | | |
|---|---|---|
| 6,859,481 B2 | 2/2005 | Zheng |
| 7,032,431 B2 | 4/2006 | Baum et al. |
| 7,061,022 B1 | 6/2006 | Pham et al. |
| 7,088,076 B2 | 8/2006 | Densham et al. |
| 7,424,042 B2 | 9/2008 | Day et al. |
| 7,466,734 B1 | 12/2008 | Day et al. |
| 7,492,806 B2 | 2/2009 | Day et al. |
| 7,535,656 B2 | 5/2009 | Day et al. |
| 7,535,936 B2 | 5/2009 | Day et al. |
| 7,733,925 B2 | 6/2010 | Pushkarsky et al. |
| 7,796,341 B2 | 9/2010 | Day et al. |
| 7,826,503 B2 | 11/2010 | Day et al. |
| 7,848,382 B2 | 12/2010 | Weida et al. |
| 7,869,475 B2 * | 1/2011 | Rossi et al. .............. 372/34 |
| 7,873,094 B2 | 1/2011 | Day et al. |
| 7,920,608 B2 | 4/2011 | Marsland, Jr. et al. |
| 8,050,307 B2 | 11/2011 | Day et al. |
| 8,068,521 B2 | 11/2011 | Weida et al. |
| 8,189,630 B2 | 5/2012 | Marsland, Jr. et al. |
| 8,306,077 B2 | 11/2012 | Pushkarsky et al. |
| 8,335,413 B2 | 12/2012 | Dromaretsky et al. |
| 2002/0064198 A1 | 5/2002 | Koizumi |
| 2002/0105699 A1 | 8/2002 | Miracky et al. |
| 2002/0176473 A1 | 11/2002 | Mouradian |
| 2003/0043877 A1 | 3/2003 | Kaspi |
| 2003/0127596 A1 | 7/2003 | Kosterev et al. |
| 2004/0013154 A1 | 1/2004 | Zheng |
| 2004/0208602 A1 | 10/2004 | Plante |
| 2004/0228371 A1 | 11/2004 | Kolodzey et al. |
| 2004/0238811 A1 | 12/2004 | Nakamura et al. |
| 2004/0264523 A1 | 12/2004 | Posamentier |
| 2005/0207943 A1 | 9/2005 | Puzey |
| 2005/0213627 A1 | 9/2005 | Masselink et al. |
| 2006/0056466 A1 | 3/2006 | Belenky et al. |
| 2006/0268947 A1 | 11/2006 | Kalayeh |
| 2007/0030865 A1 | 2/2007 | Day et al. |
| 2007/0291804 A1 | 12/2007 | Day et al. |
| 2008/0075133 A1 | 3/2008 | Day et al. |
| 2008/0198027 A1 | 8/2008 | Bugge |
| 2008/0232413 A1 | 9/2008 | Leavitt et al. |
| 2009/0110019 A1 | 4/2009 | Houde-Walter et al. |
| 2009/0224153 A1 | 9/2009 | Houde-Walter |
| 2010/0132581 A1 | 6/2010 | Day et al. |
| 2010/0243891 A1 | 9/2010 | Day |
| 2010/0302796 A1 | 12/2010 | Pushkarsky |
| 2011/0173870 A1 | 7/2011 | Day |
| 2011/0222566 A1 | 9/2011 | Weida |
| 2012/0039349 A1 | 2/2012 | Priest |
| 2012/0057254 A1 | 3/2012 | Arnone |
| 2012/0068001 A1 | 3/2012 | Pushkarsky |
| 2012/0076160 A1 | 3/2012 | Caffey |
| 2012/0106160 A1 | 5/2012 | Pushkarsky |
| 2012/0210589 A1 | 8/2012 | Marsland et al. |
| 2013/0022311 A1 | 1/2013 | Pushkarsky |

* cited by examiner

MOUNTING BASE FOR A LASER SYSTEM

RELATED INVENTION

This application claims priority on U.S. Provisional Application Ser. No. 61/545,931, filed Oct. 11, 2011 and entitled "MOUNTING BASE FOR LASER SYSTEM". As far as permitted, the contents of U.S. Provisional Application Ser. No. 61/545,931 are incorporated herein by reference.

BACKGROUND

A laser source can be used for many things, including but not limited to testing, measuring, diagnostics, pollution monitoring, leak detection, security, pointer tracking, jamming a guidance system, analytical instruments, homeland security and industrial process control.

During use, the laser source can be positioned on a mounting base that supports the laser source and additional elements of a laser system. Unfortunately, the use of lasers can often generate substantial heat, which heats up the mounting base as well as the laser source, and which may affect the performance of the laser. Accordingly, it is necessary to efficiently remove heat from the laser and the mounting base.

SUMMARY

The present invention is directed toward a laser source assembly comprising a laser system, a redirector assembly, a mounting base, and a temperature control system. The laser system includes a first laser source that generates a first beam. The redirector assembly redirects the first beam. The mounting base supports the first laser source, the mounting base including (i) a first side wall having a first side top and a first side bottom, and (ii) a base floor that extends away from the first side wall between the first side top and the first side bottom, the base floor retaining at least a portion of the redirector assembly. The temperature control system controls the temperature of one or more of the laser system and the mounting base, the temperature control system including a first heat transferor that is positioned substantially adjacent to an outer surface of the first side wall, so that heat generated by the first laser source is transferred away from the base floor and through the first side wall to the first heat transferor.

As described herein, during use, the mounting base inhibits heat generated from the use of the laser sources from affecting the precision of the output beam pointing and positioning. Moreover, the mounting base provides structural rigidity and optical alignment stability for the laser sources during ambient temperature variation, during shock or vibration, and during ambient pressure variation, any of which can be present during use of the laser source assembly.

Further, with the present design, the temperature of certain critical laser components (e.g. the first laser source) can be controlled, while allowing the temperature of the base floor of the mounting base to follow ambient temperature. Because the temperature of the base floor is not actively maintained, this minimizes the total thermal mass requiring temperature control, and thus the time required to cool down the temperature controlled laser components, and/or to warm up the temperature controlled laser components upon start-up.

Moreover, with the present design, during ambient temperature variation, the system provides optical positioning stability by inhibiting and/or reducing the mechanical effects of temperature gradients. This is done both by symmetrically placing the heat sources and the temperature control system (i.e. heat transferors and/or temperature adjusters) on the mounting base to reduce thermal gradients, and by design of the mounting base to provide mechanical stability over a range of temperatures and temperature gradients.

Additionally, the mounting base provides stability under ambient pressure change because the design allows for the equalization of forces on the top and bottom of the laser source assembly, and provides structural stability through symmetry of the mounting base itself that helps mitigate unequal stresses from pressure change.

In certain embodiments, the mounting base is not actively, thermally controlled, but just the individual laser modules are individually, thermally controlled. In some embodiments, the system is designed and the components are positioned to manage the thermal gradients of the mounting base, while allowing the mounting base to float in temperature, all while preserving optical alignment. In certain embodiments, the mounting base further includes a second side wall having a second side top and a second side bottom. In such embodiment, the base floor extends away from the second side wall between the second side top and the second side bottom. Further, the base floor extends between the first side wall and the second side wall. In one such embodiment, the base floor extends between approximately a center of the first side wall and approximately a center of the second side wall. For example, in one embodiment, the mounting base can include a substantially H-shaped cross-sectional region.

Additionally, in one embodiment, the base floor further includes a first floor aperture, wherein at least a portion of the first laser source is positioned within the first floor aperture.

In one embodiment, the temperature control system further includes a first temperature adjuster that is positioned within the first laser source, and a second temperature adjuster that is positioned substantially between the first laser source and the first side wall. With this design, heat generated by the laser source is transferred to the side wall away from the base floor.

In some embodiments, the laser system further includes a second laser source that generates a second beam. In this embodiment, the first beam and the second beam can be combined to create an assembly output beam.

Additionally, in another embodiment, the present invention is directed toward a laser source assembly comprising a first laser source that generates a first beam; and a mounting base that supports the first laser source, the mounting base including (i) a first side wall having a first side top and a first side bottom, (ii) a second side wall having a second side top and a second side bottom, and (iii) a base floor that extends between the first side wall and the second side wall, the base floor extending away from the first side wall between the first side top and the first side bottom, and the base floor extending away from the second side wall between the second side top and the second side bottom.

Further, in still another embodiment, the present invention is directed toward a laser source assembly comprising (i) a first laser source that generates a first beam, and a second laser source that generates a second beam; (ii) a beam combiner that combines the first beam and the second beam to create an assembly output beam, the beam combiner including a redirector assembly that redirects the first beam and the second beam, the base floor retaining at least a portion of the redirector assembly; and (iii) a mounting base that supports the first laser source and the second laser source, the mounting base including a base floor having a first floor aperture and a second floor aperture, wherein at least a portion of the first laser source is positioned within the first floor aperture, and wherein at least a portion of the second laser source is positioned within the second floor aperture.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1:
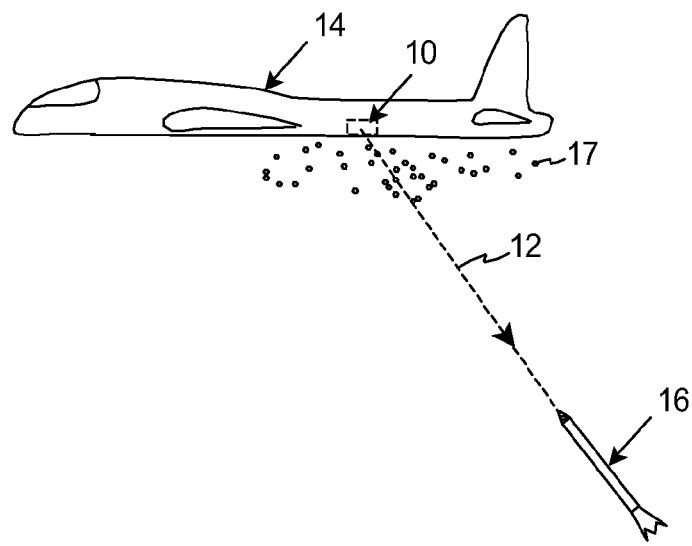
FIG. 1 is simplified side illustration of an aircraft and a laser source assembly having features of the present invention that generates an assembly output beam.

FIG. 1 is simplified side illustration of an aircraft 14 and a laser source assembly 10 (illustrated in phantom) having features of the present invention that generates an assembly output beam 12 (illustrated with a dashed arrow line). As an overview, in certain embodiments, the laser source assembly 10 includes a mounting base 226 (illustrated in FIG. 2A), that supports a laser system 228. As described in herein, the mounting base 226 is designed to inhibit the heat generated by the laser system 228 from adversely influencing the assembly output beam 12. More particularly, the mounting base 226 is designed to provide structural rigidity and optical alignment stability for the laser system 228 during ambient temperature variation, during vibration, and during ambient pressure variation.

There are a number of possible usages for the laser source assembly 10 disclosed herein. In one non-exclusive embodiment, as illustrated in FIG. 1, the laser source assembly 10 can be utilized on the aircraft 14 (e.g., a plane or helicopter) with a pointer tracker system (not shown) for protecting the aircraft 14 from an anti-aircraft missile 16 that may be locked onto the heat emitting from the aircraft 14. Alternatively, for example, the laser source assembly 10 can be used for a free space communication system in which the laser source assembly 10 is operated in conjunction with a detector located far away, to establish a wireless, directed, invisible data link. Still alternatively, the laser source assembly 10 can be used for any application requiring transmittance of directed infrared radiation through the atmosphere at the distance of thousands of meters, to simulate a thermal source to test IR imaging equipment, for spectrometers, or any other applications.

Figure 2A:
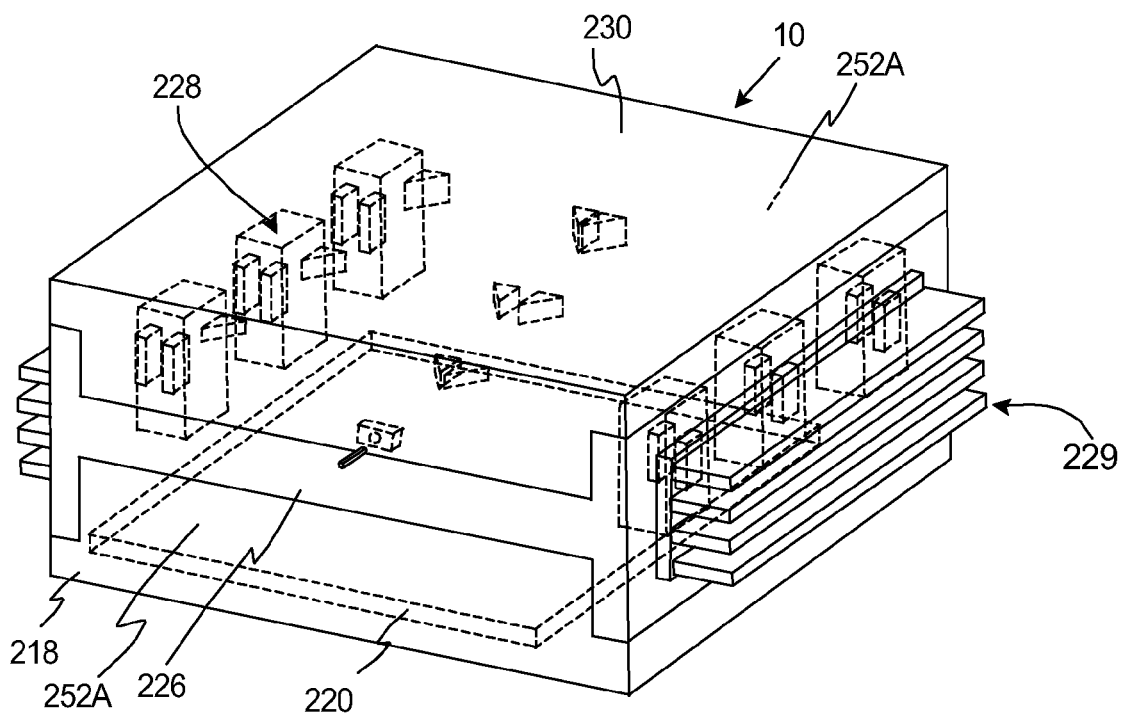
FIG. 2A is a simplified perspective view of an embodiment of the laser source assembly of FIG. 1, the laser source assembly including a mounting base, a laser system, and a temperature control system.

FIG. 2A is a simplified perspective view of an embodiment of the laser source assembly 10 of FIG. 1. The design, size and shape of the laser source assembly 10 can be varied pursuant to the teachings provided herein. In FIG. 2A, the laser source assembly 10 is generally rectangular box shaped and includes a bottom cover 218, a system controller 220 (illustrated in phantom) that is stacked on the bottom cover 218, a mounting base 226 that is stacked on top of the bottom cover 218, a laser system 228 (illustrated in phantom) that is secured to the mounting base 226, a temperature control system 229, and a top cover 230 that covers the top of the mounting base 226. Alternatively, the laser source assembly 10 can be designed with greater or fewer components than are illustrated in FIG. 2A and/or the arrangement of these components can be different than that specifically illustrated in FIG. 2A. For example, in one embodiment, the laser source assembly 10 can additionally and/or alternatively include a second system controller (not shown) that is positioned adjacent to an underside of the top cover 230 to provide symmetry. Further, the size and shape of these various components can be different than that illustrated in FIG. 2A.

The laser source assembly 10 can be powered by a generator, e.g., the generator for the aircraft 14 (illustrated in FIG. 1), a battery, or another power source.

It should be noted that the mounting base 226 is uniquely designed to create an upper chamber 252A in cooperation with the top cover 230, and a lower chamber 252B in cooperation with the bottom cover 218. In certain embodiments, the chambers 252A, 252B can provide a controlled environment for the sensitive components of the laser system 228. More specifically, the upper chamber 252A, and the lower chamber 252B can be sealed. Further, an environment in each sealed chamber 252A, 252B can be controlled. For example, the sealed chambers 252A, 252B can be filled with an inert gas, or another type of fluid, or subjected to vacuum.

With the present design, any changes in ambient pressure will result in equal and opposite forces on the top cover 230 and the bottom cover 218 that will substantially cancel out the influence on the mounting base 226 due to the symmetry of the chambers 252A, 252B. Stated in another fashion, in conjunction with the structural symmetry of the mounting base 226, the pressure effect on the bottom cover 218 and the top cover 230 is symmetrical when the laser source assembly 10 is subjected to changes in altitude or elevation, e.g., when the aircraft 14 (illustrated in FIG. 1) goes up and down. Accordingly, any deformation experienced by the bottom cover 218 should be matched in magnitude and opposite in direction as compared with any deformation experienced by the top cover 230. Moreover, the symmetrical pressure on the bottom cover 218 and the top cover 230 helps to maintain the desired symmetry of the mounting base 226, and thus helps to inhibit any pointing errors that may otherwise occur due to pressure differences and/or pressure changes. As a result thereof, changes in ambient pressure will have a reduced influence on the shape of the mounting base 226.

Figure 2B:
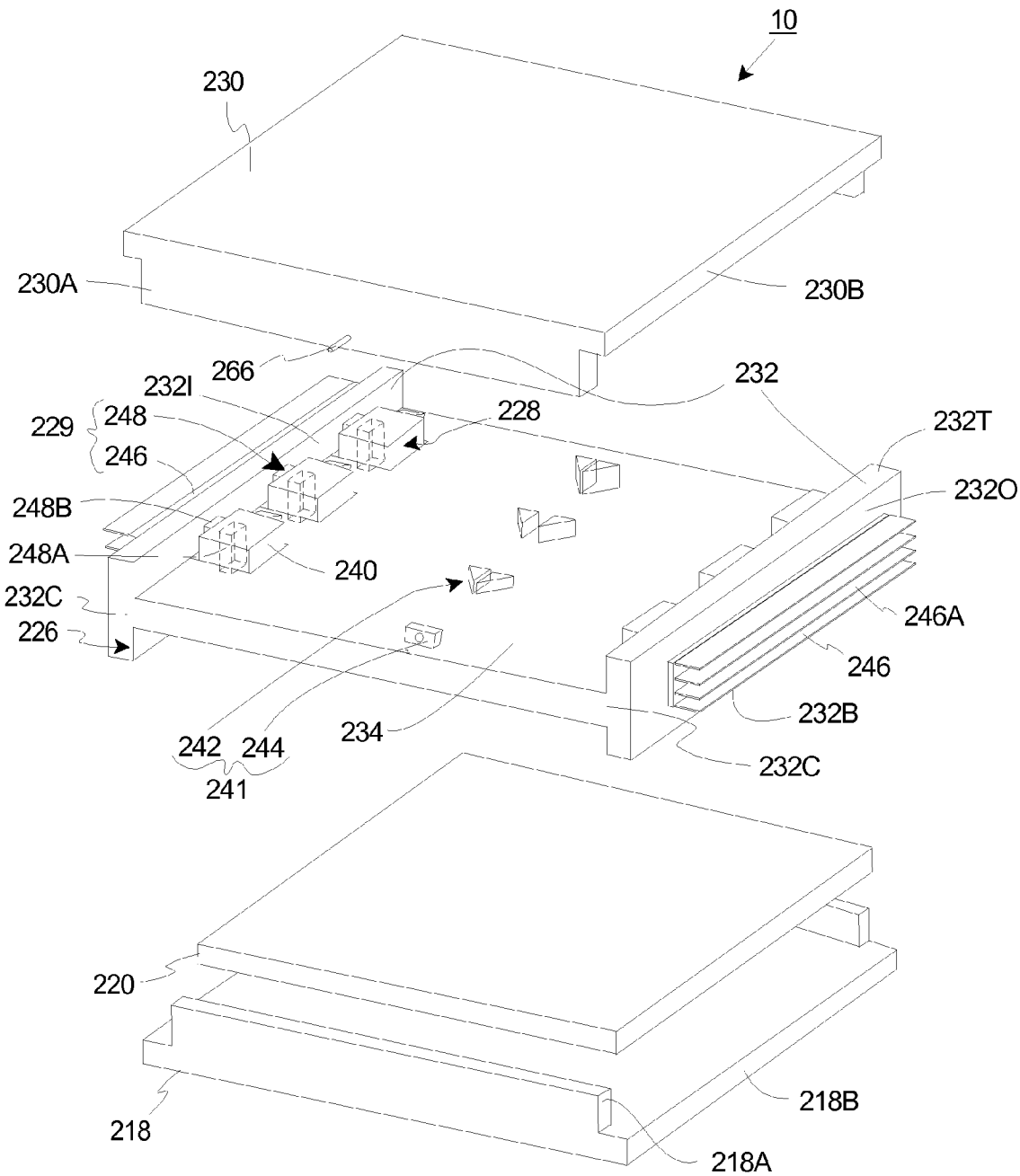
FIG. 2B is a simplified, partially exploded perspective view of the laser source assembly.

FIG. 2B is a simplified, partially exploded perspective view of the laser source assembly 10. In this embodiment, the bottom cover 218 is rigid, and is shaped somewhat similar to an inverted top to a box, having side members 218A that cantilever in a generally upward direction away from a bottom base 218B. The side members 218A of the bottom cover 218 are sized and shaped to engage a portion of the mounting base 226. Alternatively, the bottom cover 218 can have another suitable configuration. For example, the bottom cover 218 can include one or more vents (not shown) for venting some of the components of the laser source assembly 10.

The system controller 220 controls at least a portion of the operation of the temperature control system 229 and the laser system 228. For example, the system controller 220 can include one or more processors and circuits. In certain embodiments, the system controller 220 can control the current that is directed to the laser system 228. Additionally, in certain embodiments, the system controller 220 can control the operation of at least a portion of the temperature control system 229 so as to control the temperature of certain critical components of the laser system 228.

The mounting base 226 provides a rigid, homogeneous, one-piece platform to support the various components of the laser system 228 and to maintain the relative position of the various components of the laser system 228. As illustrated herein, in certain non-exclusive embodiments, the mounting base 226 is monolithic, substantially symmetrical, and includes a generally H-shaped cross-section. In particular, in this embodiment, the mounting base 226 includes a pair of spaced apart, vertical side walls 232 and a base floor 234 that extends substantially horizontally between the side walls 232. Additionally, as illustrated, the side walls 232 are substantially parallel to one another, and the base floor 234 is substantially perpendicular to each of the side walls 232. Moreover, as illustrated, each side wall 232 includes a side top 232T, a side bottom 232B, an inner surface 232I and an outer surface 232O, and the base floor 234 extends from the inner surface 232I between the side top 232T and the side bottom 232B of one side wall 232 to the inner surface 232I between the side top 232T and the side bottom 232B of the other side wall 232. In one non-exclusive embodiment, the base floor 234 extends from near or approximately at a center 232C of the inner surface 232I of one side wall 232 to near or approximately at a center 232C of the inner surface 232I of the other side wall 232. With this design, the side walls 232 function to improve the structural rigidity and stability of the base floor 234. Additionally, the structural symmetry of the H-shaped design allows the base floor 234 to maintain structural stability even over temperature and pressure extremes. Moreover, as noted above, the structural symmetry of the mounting base 226 enables the impact of any potential temperature gradients, e.g., hot spots, to be minimized in embodiments that utilize spot cooling to control the temperature of the mounting base 226.

Non-exclusive examples of suitable materials for the mounting base 226 include magnesium, aluminum, and carbon fiber composite. The mounting base 226 can be made of a material having a thermal conductivity in the range of approximately 500-2000 W/mK, and preferably in the range of approximately 1500-2000 W/mK.

The laser system 228 generates the assembly output beam 12. The design and positioning of the laser system 228 and the components used therein can be varied pursuant to the teachings provided herein. In one embodiment, the laser system 228 includes a plurality of spaced apart, individual laser sources 240, and a beam combiner 241.

In this embodiment, each of the laser sources 240 is fixedly secured to the mounting base 226. For example, each of the laser sources 240 can be secured to the inner surface 232I of the side walls 232 so that heat generated by the laser sources 240 is directly transferred to and through the side walls 232 and away from the base floor 234.

The beam combiner 241 combines the beams (not shown in FIG. 2B) that are generated from each of the laser sources 240. The design of the beam combiner 241 can be varied. In the embodiment illustrated in FIG. 2B, the beam combiner 241 includes a beam director assembly 242 and a beam focus assembly 244 that are secured to the mounting base 226. In particular, in this embodiment, the beam director assembly 242 is secured to the base floor 234 of the mounting base 226. In certain non-exclusive alternative embodiments, at least a portion of the beam director assembly 242 can be fixedly secured to one or both of the side walls 232.

Additionally, in certain embodiments, the beam combiner 241 directs the output beam onto a fiber facet of an output optical fiber 266.

The temperature control system 229 efficiently controls the temperature of the mounting base 226 and the laser system 228. For example, as shown in FIG. 2B, the temperature control system 229 can include (i) one or more heat transferors 246, e.g., heat exchangers such as a fin assembly with a high thermal conductivity or a heatsink, and (ii) one or more temperature adjusters 248, e.g., thermoelectric coolers (TECs), to selectively adjust and control the temperature of the mounting base 226 and/or the laser system 228 as necessary. In particular, in certain embodiments, the temperature control system 229 utilizes the heat transferors 246 and the temperature adjusters 248 to maintain the temperature of the laser system 228 at a predetermined temperature. In one non-exclusive embodiment, the predetermined temperature is approximately 25 degrees Celsius, although other appropriate predetermined temperatures are also possible. Alternatively, the temperature control system 229 can have a different design and/or the features of the temperature control system 229 can be positioned in a different manner than that illustrated herein.

As illustrated, the heat transferors 246 are positioned substantially adjacent to and in direct thermal contact with the side walls 232 of the mounting base 226, e.g., substantially adjacent to the outer surface 232O of the side walls 232. This allows the heat transferors 246 to efficiently transfer heat between the side walls 232 of the mounting base 226 and the surrounding environment. Additionally, in certain embodiments, the heat transferors 246 can include one or more fins 246A that can provide a relatively large surface area for heat transfer. The fins 246A can be designed to be of any suitable shape that provides a greater surface area via which heat is more effectively and efficiently transferred.

In one embodiment, the temperature control system 229 includes two heat transferors 246, with one heat transferor 246 being positioned substantially adjacent to the outer surface 232O of each of the side walls 232 of the mounting base 226. By positioning the heat transferors 246 against the side walls 232 of the mounting base 226, the heat transferors 246 can more effectively transfer the heat outwardly away from the base floor 234 of the mounting base 226. Alternatively, the temperature control system 229 can include more than two or fewer than two heat transferors 246. For example, the temperature control system 229 can include individual heat transferors 246 on the outer surface 232O of the side walls 232 of the mounting base 226 substantially opposite to the positioning of each of the laser sources 240.

The temperature adjusters 248 selectively control the temperature of the laser system 228. In one embodiment, the temperature control system 229 includes a pair of temperature adjusters 248 (in series) for each laser source 240 in order to effectively control the temperature of certain critical components of the laser source 240. More specifically, in this embodiment, for each laser source 240, the temperature control system 229 includes a first temperature adjuster 248A that is positioned within the laser source 240, and a second temperature adjuster 248B that is positioned substantially between the laser source 240 and the side wall 232 of the mounting base 226.

With this design, the temperature control system 229 is essentially spot cooling each of the laser sources 240. By employing such a spot cooling methodology, the temperature control system 229 utilizes less energy and is thus less expensive to operate as compared to a system that actively cools the entire mounting base 226. Stated in another fashion, with the present design, the temperature of the laser sources 240 can be actively controlled, while allowing the temperature of the base floor 234 of the mounting base 226 to follow ambient temperature. Further, because the temperature of the base floor 234 is not actively maintained, this minimizes the thermal mass that must be temperature controlled, and thus the time required to cool down the temperature controlled laser sources 240, and/or to warm up the temperature controlled laser sources 240 upon start-up.

In certain embodiments, the mounting base 226 is not actively, thermally controlled, but just the individual laser modules 240 are individually, thermally controlled.

Alternatively, the temperature control system 229 can utilize a different number of temperature adjusters 248 and/or the temperature adjusters 248 can be positioned in a different manner than that illustrated herein. For example, the temperature control system 229 can be designed with only a single temperature adjuster 248 for each laser source 240.

Additionally, the temperature control system 229 can utilize a separate temperature sensor (not shown), e.g., a thermistor, to sense the temperature of each laser system 228. For example, in one embodiment, the temperature sensor can be positioned near the gain medium (not shown in FIGS. 2A and 2B) to provide feedback regarding the temperature of the gain medium. The system controller 220 receives the feedback from the temperature sensor to control the operation of the temperature control system 229.

The top cover 230 is rigid, and is shaped somewhat similar to a top to a box, having side members 230A that cantilever in a generally downward direction away from a cover base 230B. The side members 230A of the cover 230 are sized and shaped to engage a portion of the mounting base 226. Alternatively, the cover 230 can have another suitable configuration.

Figure 3A:
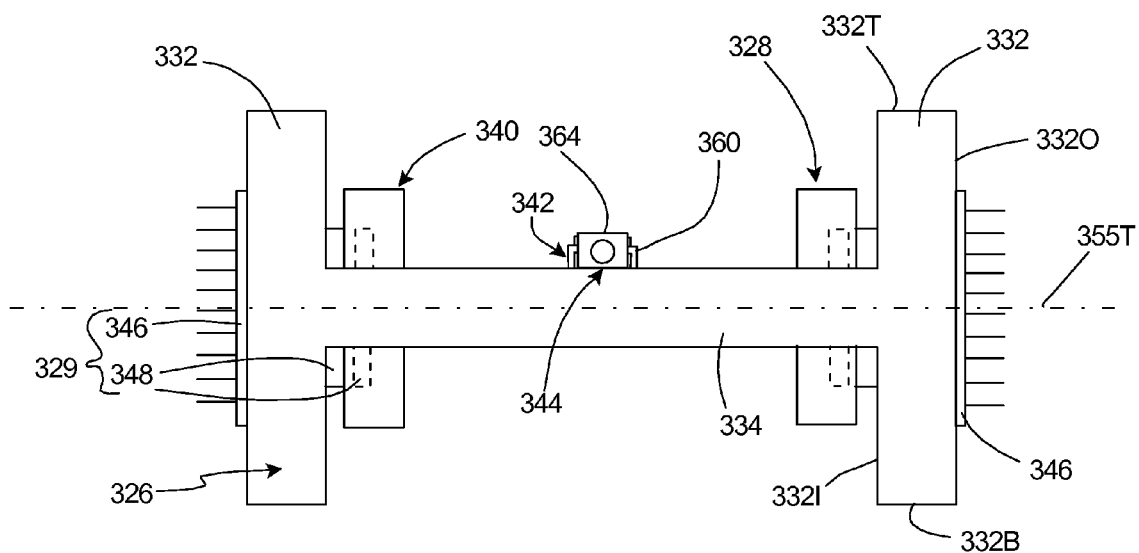
FIG. 3A is a simplified side view of an embodiment of the mounting base, the laser system, and the temperature control system illustrated in FIG. 2A.
Figure 3B:
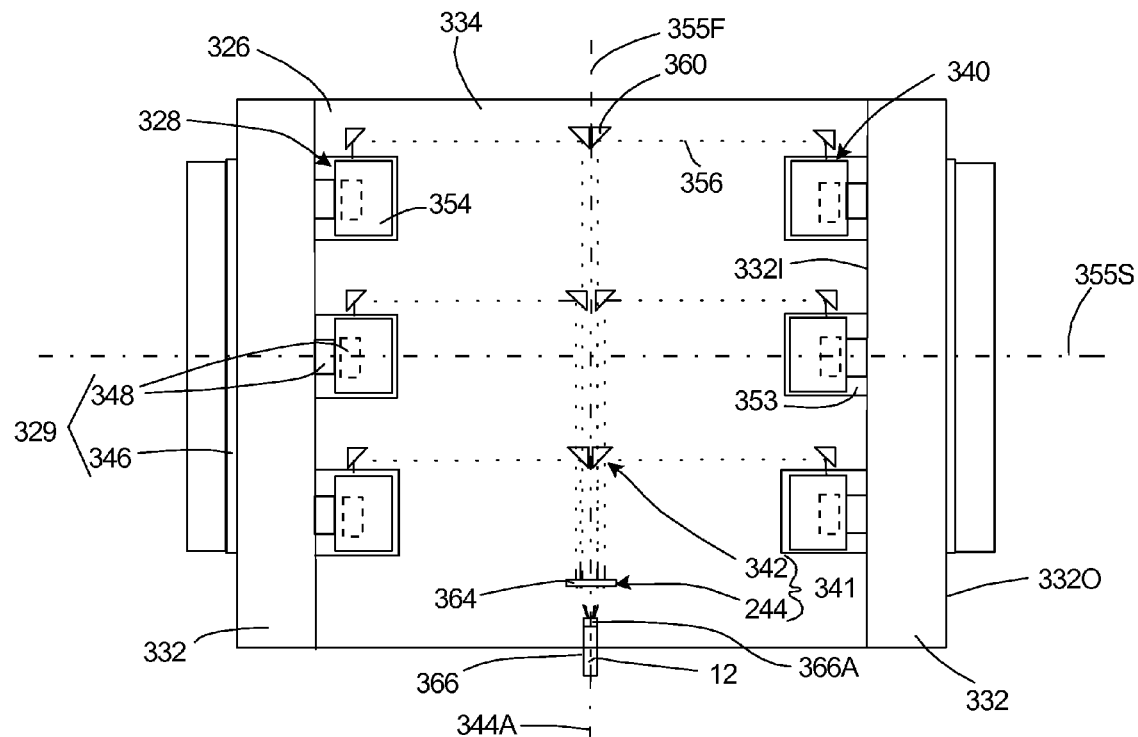
FIG. 3B is a simplified top view of the mounting base, the laser system, and the temperature control system illustrated in FIG. 3A.

FIGS. 3A is a side view and FIG. 3B is a top view of one embodiment of the mounting base 326, the laser system 328 including the plurality of laser sources 340, and the temperature control system 329. In this embodiment, the mounting base 326 includes a generally H-shaped cross-section, having the pair of spaced apart, substantially vertical side walls 332 that are substantially parallel to one another, and the substantially horizontal base floor 334 that is substantially perpendicular to each of the side walls 332 and that extends between the inner surface 332I of each of the side walls 332 between the side top 332T and the side bottom 332B of each of the side walls 332. As shown in FIGS. 3A and 3B, the mounting base 326 can be substantially symmetrical about a first planar axis 355F, a second planar axis 355S that is orthogonal to the first planar axis 355F, and a third planar axis 355T that is orthogonal to the first planar axis 355F and the second planar axis 355S.

With this design, the side walls 332 function to improve the structural rigidity and stability of the base floor 334, and the overall structural symmetry of the H-shaped design allows the base floor 334 to maintain structural stability even over temperature and pressure extremes, and/or during vibration.

Additionally, as illustrated in this embodiment, the mounting base 326 includes a plurality of spaced apart floor apertures 353 that extend through the base floor 334 near the side walls 332, i.e. near the inner surface 332I of the side walls 332, and that are sized and shaped such that a single laser source 340 can extend through and be positioned, at least in part, within each floor aperture 353. In this embodiment, the mounting base 326 includes six floor apertures 353, with three floor apertures 353 being substantially evenly spaced apart adjacent to each of the side walls 332 of the mounting base 326. Additionally and/or alternatively, three floor apertures 353 can be substantially symmetrically positioned on each side of the first planar axis 355F of the base floor 334 of the mounting base 326. Still alternatively, the mounting base 326 can be designed to have greater than six or less than six floor apertures 353, and/or the floor apertures 353 can have a different orientation and positioning relative to the other floor apertures 353 and/or to the rest of the mounting base 326. For example, in one embodiment, the floor apertures 353 can be positioned away from the side walls 332 of the mounting base 326. In one embodiment, each floor aperture 353 is sized and shaped to have a space between the laser source 340 and the base floor 334.

Further, as illustrated, each laser source 340 extends through one of the floor apertures 353 in the base floor 334 and each laser source 340 is mounted to the inner surface 332I of one of the side walls 332. With this design, each laser source 340 is spaced apart from the base floor 334. As a result thereof, the heat generated by the laser sources 340 can be more effectively directed outwardly through the side walls 332 and away from the base floor 334. Stated in another fashion, the heat generated by the laser sources 340 is transferred directly to the respective side wall 332 and inhibited from being transferred to the base floor 334.

In alternative embodiments, one or more of the laser sources 340 can be a mid-infrared (MIR) laser sources 354 and/or one or more of the laser sources can be a non-MIR laser sources (not shown in FIGS. 3A and 3B). In certain embodiments, each of the MIR laser sources 354 generate a narrow linewidth, accurately settable MIR beam 356 (illustrated with a dashed line) having a center wavelength that is within the MIR range, and each of the non-MIR laser sources can generate a separate non-MIR beam (not shown in FIGS. 3A and 3B) having a center wavelength that is outside the MIR range. As used herein, the term mid-infrared range signifies a beam having a center wavelength in the range of approximately 3-14 microns ($\mu m$). For example, the non-MIR laser source can be a Band I laser source.

Further, each of the laser sources 340 can be a single emitter infrared semiconductor laser. As a result thereof, utilizing multiple single emitter infrared semiconductor lasers, the assembly can generate a multiple watt, assembly output beam 12. The exact wavelength of the MIR beams 356 and/or the non-MIR beams that will effectively perform the desired function(s) can vary. However, with the present invention, the laser sources 340 can be accurately tuned to the appropriate wavelength as necessary to perform the desired function.

In certain embodiments, one aspect of the beams 356 is the ability propagate through the atmosphere 17 (illustrated as small circles in FIG. 1) with minimal absorption. With the present invention, each of the MIR laser sources 354 can be individually tuned so that a specific wavelength of the MIR beams 356 of one or more of the MIR laser sources 354 is the same or different than that of the other MIR beams 356. Thus, the MIR laser sources 354 can be tuned so that the portion of the assembly output beam 12 generated by the MIR laser sources 354 is primarily a single wavelength beam or is primarily a multiple wavelength (incoherent) beam.

Further, it should be noted that each MIR laser source 354 can generate an MIR beam 356 having a power of between approximately 0.5 and 3.0 watts. As a result thereof, six MIR laser sources 354 can generate a combined power of between approximately 3.0 and 18.0 watts.

In the embodiment illustrated in FIGS. 3A and 3B, the laser system 328 includes six separate, spaced apart laser sources 340 that are fixedly secured to the inner surface 332I of the side walls 332. Further, in this embodiment, three laser sources 340 are substantially symmetrically positioned on each side of the first planar axis 355F of the base floor 334. Still alternatively, the laser system 328 can include greater than six or less than six laser sources 340 and/or the laser sources 340 can be positioned in a different manner relative to the mounting base 326 and relative to the other laser sources 340. It should be noted that the power output and other characteristics of the assembly output beam 12 can be adjusted by changing the number of laser sources 340. Alternatively, the laser sources 354 can be positioned in a different manner relative to one another.

The beam combiner 341 includes the beam director assembly 342 and the beam focus assembly 344 that cooperate to combine the MIR beams 356. Alternatively, for example, the beam combiner 341 can be designed without the beam focus assembly 344.

The beam director assembly 342 directs and steers the MIR beams 356. As provided herein, in one embodiment, the beam director assembly 342 directs the MIR beams 356 at the beam focus assembly 344 in a substantially parallel arrangement with a combiner axis 344A. Stated in another fashion, the beam director assembly 342 combines the MIR beams 356 by directing the beams 356 to be substantially parallel to each other (i.e. so that the beams 356 travel along substantially parallel axes). Further, the beam director assembly 342 causes the MIR beams 356 to be directed in the same direction, with the beams 356 overlapping, or being adjacent to each other. In one embodiment, the individual MIR beams 356 are steered to co-propagate parallel to each other, with the distance between the beam centers of each of the beams 356 being close to the individual beam diameter of each of the beams 356.

In one embodiment, the beam director assembly 342 can include a plurality of beam directors 360 (e.g., mirror mounts) that are secured to the base floor 334 of the mounting base 326. Each beam director 360 can be a beam steering prism that includes a coating that reflects the beams 356, 356. More specifically, in the embodiment illustrated in FIGS. 3A and 3B, the beam director assembly 342 includes a pair of spaced apart, independently adjustable (e.g. about two or more degrees of freedom relative to the mounting base 326) beam directors 360 that cooperate to steer each of the MIR beams 356 to be approximately parallel to and adjacent to the combiner axis 344A. Further, in this embodiment, each of the beams 356 are controlled by the beam director assembly 342 to be directed in the same direction (i.e. at the beam focus assembly 344). It should be noted that the beam directors 360 are specifically positioned depending on the initial direction of the beam 356 generated from the laser source 354, and so as to properly direct the beams 356 toward the beam focus assembly 344.

Alternatively, one or more of the beam directors 360 can be secured to one of the side walls 332 of the mounting base 326. For example, if one or more of the laser sources 340 generate a beam that is initially directed in a generally upward or downward direction, the first beam director 360 for steering that beam can be mounted on one of the side walls 332.

It should be noted that in FIG. 3A, the positioning of the beam directors 360 has been exaggerated slightly to show how the beam directors 360 near the center of the base floor 334 (i.e. toward the first planar axis 355F illustrated in FIG. 3B) are positioned somewhat one behind another relative to the beam focus assembly 344, with the beam directors 360 also being positioned somewhat higher or taller the farther away the beam directors 360 are from the beam focus assembly 344. With this design, the beams 356 being redirected by the beam directors 360 will not be interfered with by the other beam directors 360.

Additionally and/or alternatively, the beam director assembly 342 can further include one or more dichroic filters (not shown) that transmit beams in the MIR range while reflecting beams in the non-MIR range.

The beam focus assembly 344 spatially combines and optically multiplexes the MIR beams 356 to provide the assembly output beam 12. In one embodiment, the beam focus assembly 344 includes a combiner lens 364 that focuses the output beam 12 onto the output optical fiber 366. In one embodiment, the combiner lens 364 is a spherical lens having an optical axis that is aligned with the combiner axis 344A. Alternatively, the combiner lens 364 may be aspherical. In one embodiment, the output optical fiber 366 is a multi-mode fiber that transmits the multiple mode, assembly output beam 12.

A more detailed description of a high output mid infrared laser source assembly can be found in U.S. application Ser. No. 12/427,364, filed on Apr. 21, 2009, and entitled "High Output, Mid Infrared Laser Source Assembly". As far as is permitted, the contents of U.S. application Ser. No. 12/427,364 are incorporated herein by reference.

As shown in the embodiment illustrated in FIGS. 3A and 3B, the temperature control system 329 includes (i) a pair of heat transferors 346, with one heat transferor 346 being positioned along the length of each of the side walls 332 of the mounting base 326; and (ii) for each laser source 340, a pair of temperature adjusters 348 positioned within and/or adjacent to each of the laser sources 340.

Each of the heat transferors 346 is positioned along the outer surface 332O of one of the side walls 332 of the mounting base 326. Additionally, the heat transferors 346 can extend substantially along the entire length of the side walls 332 so as to effectively withdraw heat from each of the laser sources 340 that are positioned substantially adjacent to each side wall 332. Alternatively, a separate heat transferor 346 can be positioned along the outer surface 332O for each laser source 340.

The positioning of each of the laser sources 340 substantially adjacent to the side walls 332 allows for good heat removal from the mounting base 326 to the heat transferors 346. Moreover, the heat path away from the base floor 334 out through the heat transferors 346 provides a valuable method for managing and/or minimizing any thermal gradient, i.e. hot spots, that may be present in the base floor 334 due to the operation of the laser sources 340.

Additionally, for each laser source 340, one temperature adjuster 348 can be positioned within the body of the laser source 340 and one temperature adjuster 348 can be positioned substantially between the laser source 340 and the side wall 332. With this design, the temperature adjusters 348 are essentially stacked so as to more effectively and efficiently adjust the temperature of the laser source 340.

Alternatively, the temperature control system 329 can be designed to include more than two or less than two temperature adjusters 348 for each laser source 340, and/or the temperature adjusters 348 can be positioned in a different manner relative to the laser source 340, and the mounting base 326.

As provided herein, the positioning of the laser sources 340, the heat transferors 348, and the temperature adjusters 348, enables the heat generated by the laser sources 340 to be effectively transferred away from the base floor 334 and through the vertical side walls 332. Such positioning further helps to inhibit undesired stresses (e.g., bowing due to temperature differences within the base floor 334) from impacting the structural integrity of the base floor 334, and thus the precision positioning of the beam directors 360.

Figure 4A:
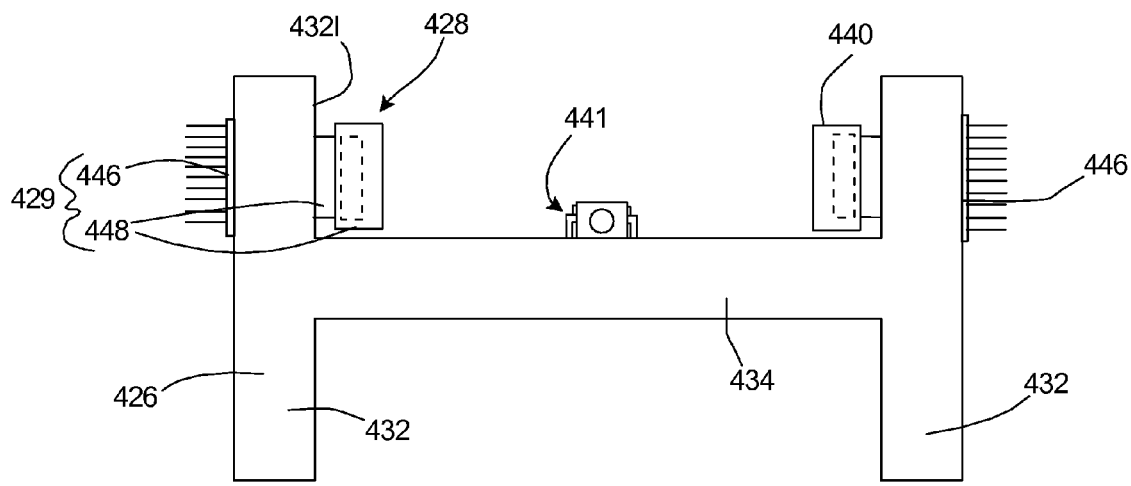
FIG. 4A is a simplified side view of another embodiment of a mounting base, a laser system, and a temperature control system having features of the present invention.
Figure 4B:
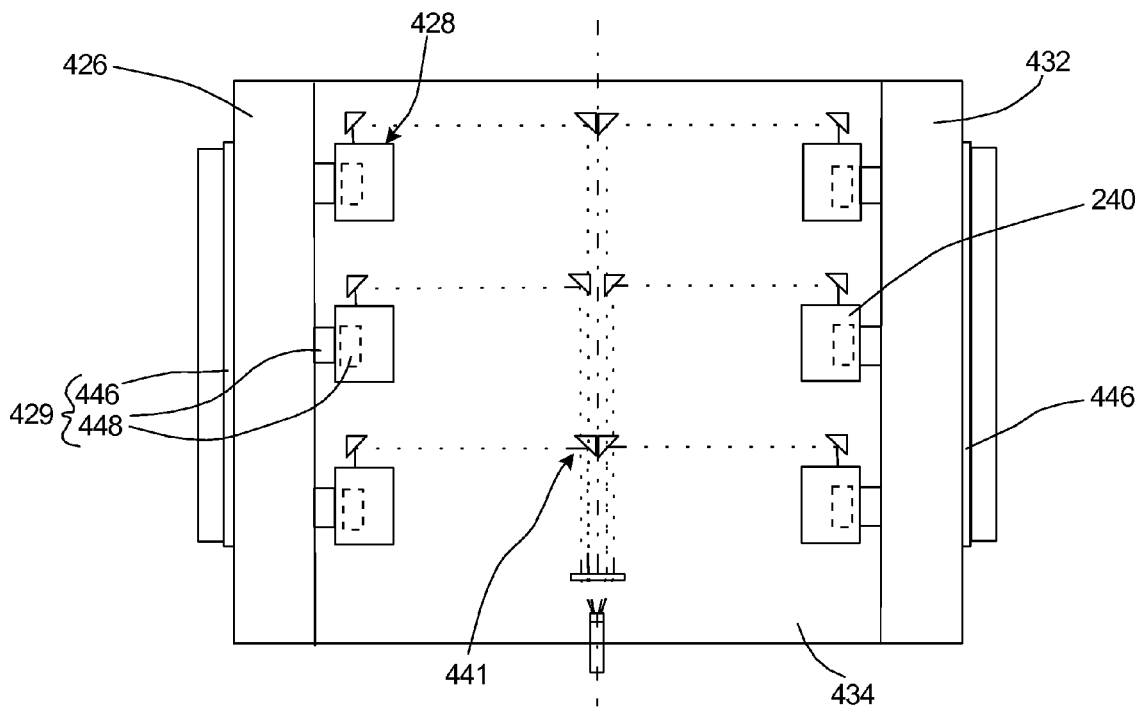
FIG. 4B is a simplified top view of the mounting base, the laser system, and the temperature control system illustrated in FIG. 4A.

FIG. 4A is a simplified side view and FIG. 4B is a simplified top view of another embodiment of a mounting base 426, a laser system 428, and a temperature control system 429 having features of the present invention. The mounting base 426, the laser system 428 and the temperature control system 429 illustrated in FIGS. 4A and 4B are somewhat similar to the corresponding components illustrated and described in relation to FIGS. 3A and 3B.

For example, in this embodiment, the mounting base 426 is again generally H-shaped, having a pair of spaced apart, substantially vertical side walls 432 that are substantially parallel to one another, and a substantially horizontal base floor 434 that extends substantially perpendicular to each of the side walls 432 between the side walls 432. Additionally, in this embodiment, the laser system 428 again includes six spaced apart laser sources 440 that are positioned substantially adjacent to the side walls 432. However, in this embodiment, the mounting base 426 does not include the floor apertures. However, the laser sources 440 are still secured to the inner surface 432I of the side walls 432 above the base floor 434. Alternatively, one or more of the laser sources 440 can be secured to the base floor 434 adjacent to the side walls 432. Still alternatively, the laser system 428 can include laser sources (not shown) secured to the side walls 432 or the base floor 434 below the base floor 434. In such embodiments, these additional laser sources below can be directly opposite the laser sources 440 positioned above the base floor 434. The positioning of laser sources 440 on both the top and the bottom can further enhance the symmetry of any heat loads that occur within the base floor 434 of the mounting base 426.

Further, in this embodiment, the laser system 428 again includes the beam combiner 441 that combines the beams generated from the plurality of laser sources 440 similar to the design described above.

Additionally, in this embodiment, similar to the embodiment described above and illustrated in FIGS. 3A and 3B, the temperature control system 429 again includes (i) a pair of heat transferors 446, with one heat transferor 446 being positioned along the length of each of the side walls 432 of the mounting base 426; and (ii) a pair of temperature adjusters 448 positioned within and/or adjacent to each of the laser sources 440.

It should be noted that the positioning of each of the laser sources 440 substantially adjacent to the side walls 432 of the mounting base 426 allows for good heat removal from the mounting base 426 to the heat transferors 446. Moreover, the heat path away from the base floor 434, to and through the side walls 432, and out through the heat transferors 446 provides a valuable method for managing and/or minimizing any thermal gradient, i.e. hot spots, that may be present in the base floor 434 due to the operation of the laser sources 440.

Figure 5A:
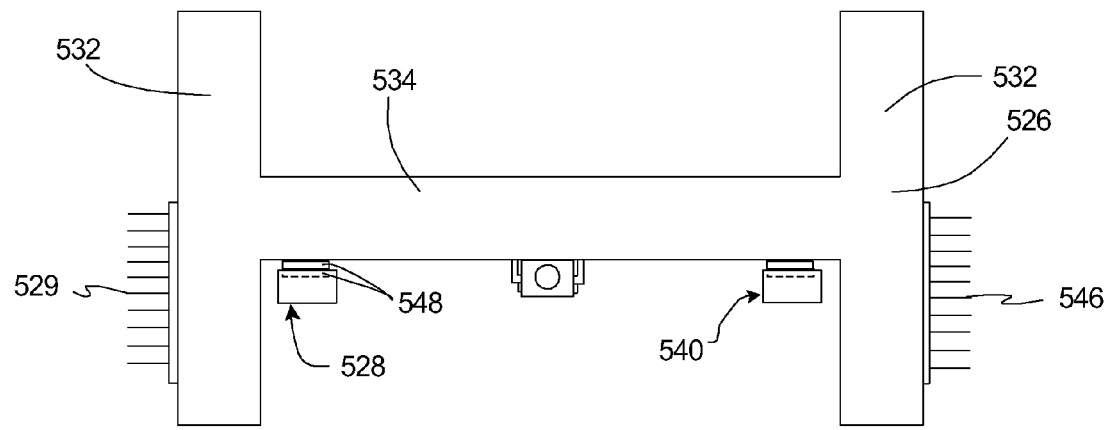
FIG. 5A is a simplified side view of still another embodiment of a mounting base, a laser system, and a temperature control system having features of the present invention.
Figure 5B:
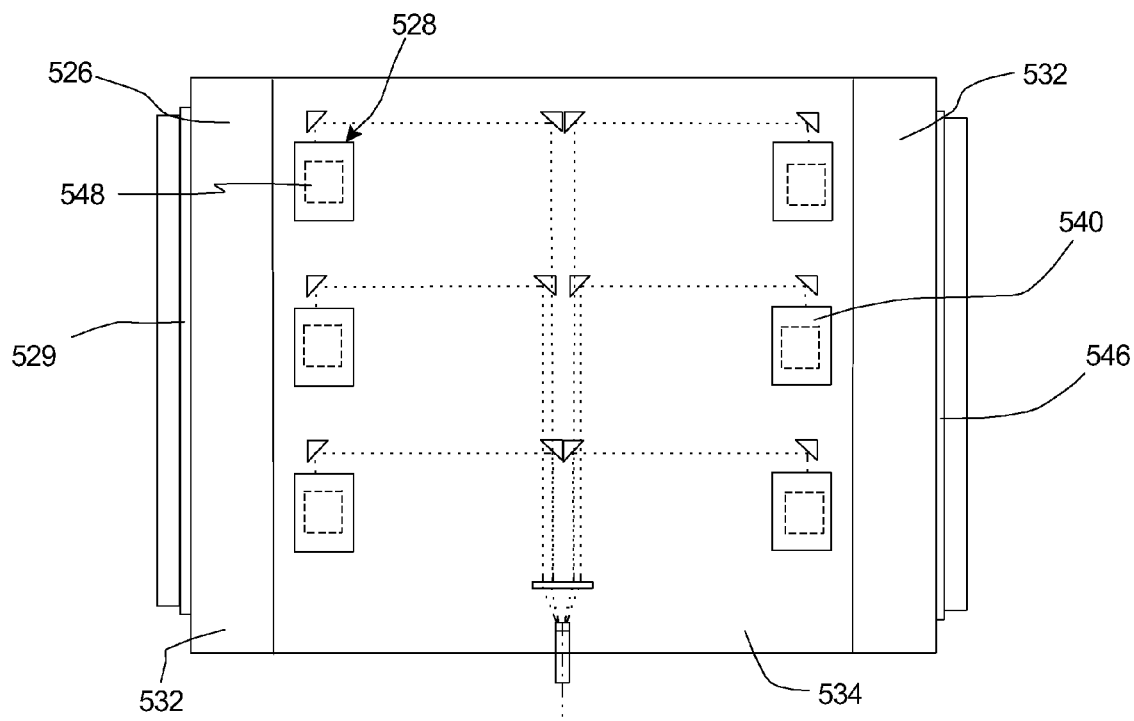
FIG. 5B is a simplified bottom view of the mounting base, the laser system, and the temperature control system illustrated in FIG. 5A.

FIG. 5A is a simplified side view and FIG. 5B is a simplified bottom view of still another embodiment of a mounting base 526, a laser system 528, and a temperature control system 529 having features of the present invention. The mounting base 526, the laser system 528 and the temperature control system 529 illustrated in FIGS. 5A and 5B are somewhat similar to the corresponding components described above and illustrated in FIGS. 4A and 4B. However, in this embodiment, the laser sources 540 are secured to the bottom of the base floor 534 near the side walls 532 of the mounting base 532. In alternative, non-exclusive embodiments, a center of each laser source 540 is attached to the base floor 534 within at least approximately five, ten, fifteen, twenty, twenty-five, thirty, thirty-five, or forty millimeters of the closest side wall 532.

Additionally, in this embodiment, similar to the embodiment described above and illustrated in FIGS. 4A and 4B, the temperature control system 529 again includes (i) a pair of heat transferors 546, with one heat transferor 546 being positioned along the length of each of the side walls 532; and (ii) for each laser source 540, a pair of temperature adjusters 548 positioned within and/or adjacent to each of the laser sources 540.

With this design, the positioning of each of the laser sources 540 substantially adjacent to the side walls 532 allows for good heat removal from the mounting base 526 to the heat transferors 546. Moreover, the heat path away from the base floor 534, to and through the side walls 532, and out through the heat transferors 546 manages and/or minimizes thermal gradients in the base floor 534.

Figure 6:
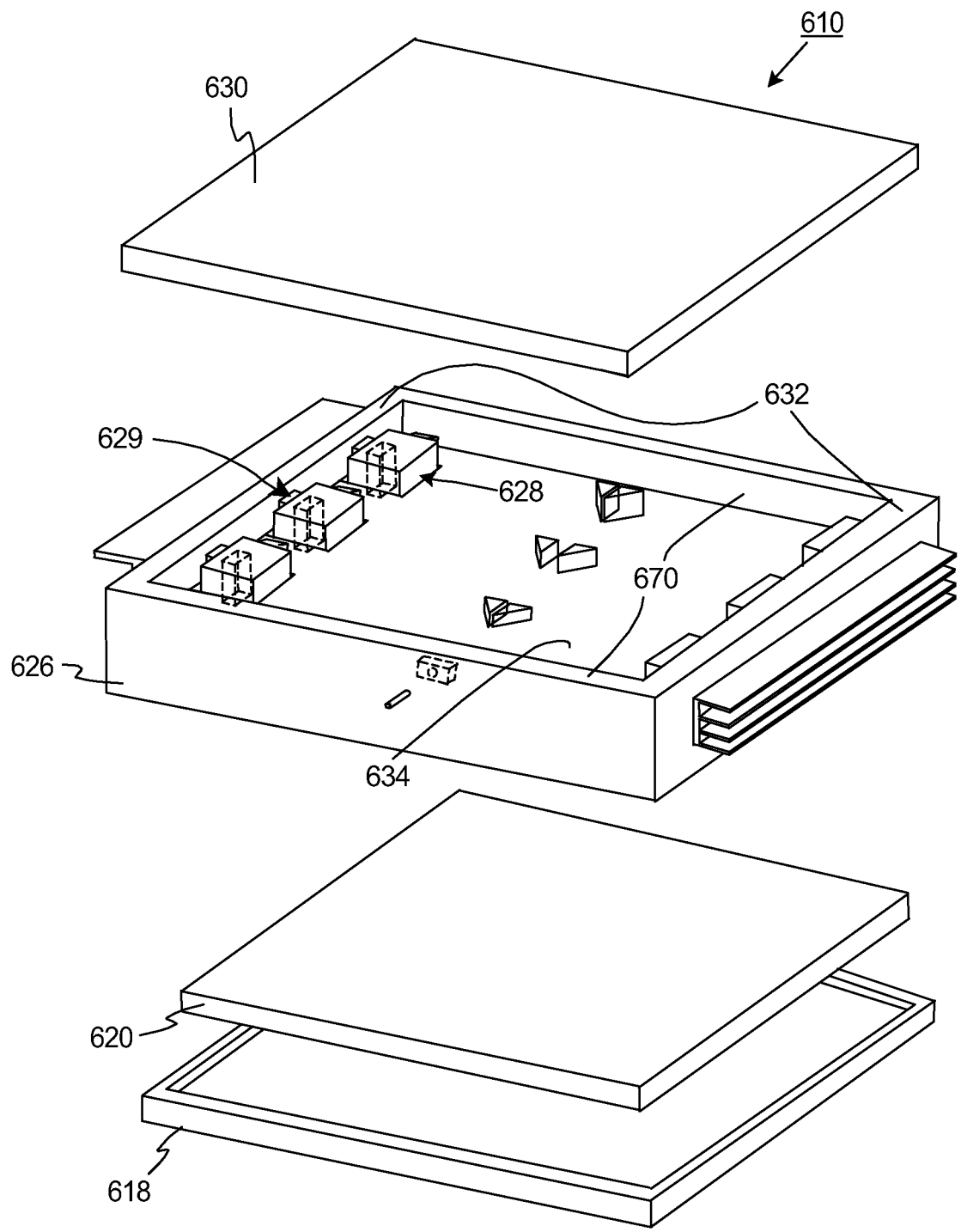
FIG. 6 is a simplified, partially exploded perspective view of another embodiment of a laser source assembly having features of the present invention.

FIG. 6 is a simplified, partially exploded perspective view of another embodiment of a laser source assembly 610 that is somewhat similar to the laser source assembly 10 illustrated and described above in relation to FIGS. 2A and 2B. More particularly, the laser source assembly 610 includes a bottom cover 618, a system controller 620, a laser system 628, a temperature control system 629, and a cover 630 that are somewhat similar to the corresponding components that are illustrated and described above in relation to FIGS. 2A and 2B.

However, in this embodiment, the laser source assembly 610 further includes a mounting base 626 that is slightly different than the mounting base 226 illustrated and described above in relation to FIGS. 2A and 2B. As shown in FIG. 6, the mounting base 626 includes a pair of spaced apart, vertical side walls 632 that are substantially parallel to one another, and a base floor 634 that extends substantially perpendicular to each of the side walls 632 and substantially horizontally between the side walls 632, similar to those respective elements in the previous embodiment, plus a pair of spaced apart, vertical end walls 670. In this embodiment, the base floor 634 also extends substantially horizontally between the middle of the end walls 670 so that the mounting base 626 has a substantially H shaped cross-section.

It should be noted that in order to accommodate for the inclusion of the end walls 670 in this embodiment, the bottom cover 618 and the cover 630 are each designed without the side members 218A, 230A that were included with the bottom cover 218 and the cover 230, respectively. Thus, with the design illustrated in FIG. 6, the bottom cover 618 is positioned to interface with the bottom of each side wall 632 and with the bottom of each end wall 670. Additionally, the top cover 630 is positioned to interface with the top of each side wall 632 and with the top of each end wall 670.

Figure 7:
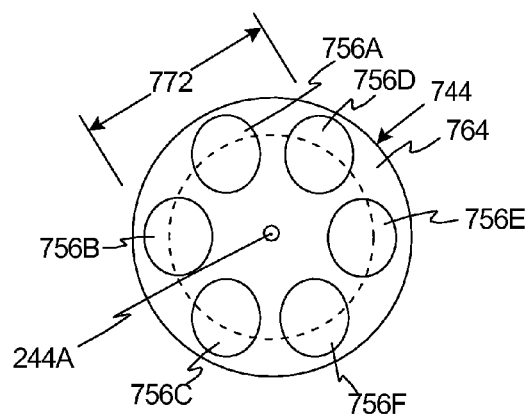
FIG. 7 is a simplified illustration of a portion of a beam combiner and a plurality of beams.

FIG. 7 is a simplified illustration of a combiner lens 764 of a beam focus assembly 744, with the plurality of beams 756A-756F directed thereon. In this embodiment, the beam director assembly 242 (illustrated in FIG. 2B) has directed the first beam 756A, the second beam 756B, the third beam 756C, the fourth beam 756D, the fifth beam 756E, and the sixth beam 756F are incident on the combiner lens 764 approximately parallel to and adjacent to the combiner axis 244A (illustrated as a small circle). Additionally, as illustrated, the beams 756A-756F are substantially equally spaced apart from one another circumferentially about the combiner axis 244A. Further, in one non-exclusive embodiment, the pattern of the beams 756A-756F is arranged to have a diameter 772 of approximately six millimeters Moreover, as illustrated, (i) the first beam 756A is positioned substantially directly above the third beam 756C; (ii) the first beam 756A is positioned at substantially the same height as the fourth beam 756D; (iii) the second beam 756B is at substantially the same height as the fifth beam 756E and the combiner axis 244A; (iv) the third beam 756C is positioned at substantially the same height as the sixth beam 756F; and (v) the fourth beam 756D is positioned substantially directly above the sixth beam 756F.

Alternatively, the beams 756A-756F can have another orientation relative to one another. For example, the beam director assembly 242 can be adjusted so that the beams 756A-756F form another pattern and/or so that the pattern has a diameter 772 that is greater than or less than approximately six millimeters.

Figure 8:
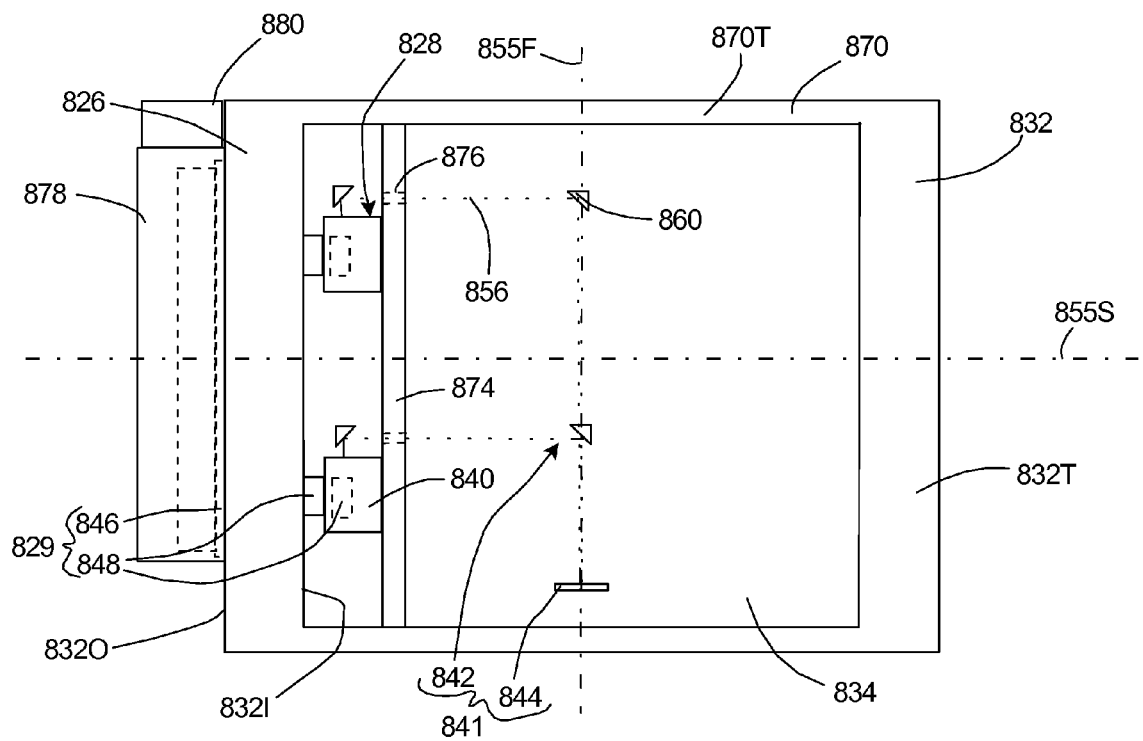
FIG. 8 is a simplified top view of still another embodiment of a mounting base, a laser system, and a temperature control system having features of the present invention.

FIG. 8 is a simplified top view of still another embodiment of a mounting base 826, a laser system 828, and a temperature control system 829 having features of the present invention. The mounting base 826, the laser system 828, and the temperature control system 829 are somewhat similar to one or more embodiments of a mounting base, a laser system, and a temperature control system as described above.

The mounting base 826 again provides a rigid, homogeneous, one-piece platform to support the various components of the laser system 828 and to maintain the position of the various components of the laser system 828. However, in this embodiment, the mounting base 826 includes (i) a pair of spaced apart, vertical side walls 832 that are substantially parallel to one another, (ii) a pair of spaced apart, vertical end walls 870, (iii) a base floor 834 that extends substantially horizontally between the side walls 832 and that extends substantially horizontally between the end walls 870, the base floor 834 extending substantially perpendicularly relative to each of the side walls 832 and each of the end walls 870, and (iv) an intermediate wall 874 the extends between the end walls 870. Moreover, as illustrated, (i) the base floor 834 extends from the inner surface 832I between the side top 832T and the side bottom (not shown) of one side wall 832 to the inner surface 832I between the side top 832T and the side bottom (not shown) of the other side wall 832; and (ii) base floor 834 extends from between the end top 870T and the end bottom (not shown) of one end wall 870 to between the end top 870T and the end bottom (not shown) of the other end wall 870. In one non-exclusive embodiment, the base floor 834 extends from near or approximately at a center (not illustrated) of the inner surface 832I of one side wall 832 to near or approximately at a center (not illustrated) of the inner surface 832I of the other side wall 832, and from near or approximately at a center (not illustrated) of one end wall 870 to near or approximately at a center (not illustrated) of the other end wall 870. With this design, aside from the inclusion of the intermediate wall 874, the mounting base 826 is again substantially symmetrical about each of a first planar axis 855F, a second planar axis 855S, and a third planar axis (not shown). Moreover, the intermediate wall 874 can be relatively thin so as to minimize any impact on the structural symmetry of the mounting base 826.

Additionally, as shown in FIG. 8, the laser system 828 includes two laser sources 840 which are secured to the inner surface 832I of one of the side walls 832. Each of the laser sources 840 generates a separate beam 856, and the laser sources 840 are spaced apart substantially adjacent to the inner surface 832I of one of the side walls 832. Moreover, the laser sources 840 are also positioned substantially adjacent to the intermediate wall 874. With this design, the intermediate wall 874 is positioned to provide thermal isolation between the laser sources 840 and other portions and elements of the laser system 828. Alternatively, the laser system 828 can be designed to have greater than or less than two laser sources 840. For example, in one non-exclusive alternative embodiment, the laser system 828 can include four laser sources 840, with two laser sources 840 positioned spaced apart and substantially adjacent to the inner surface 832I of each of the side walls 832. In such embodiment, the mounting base 826 can further include a second intermediate wall (not shown) to provide thermal isolation between the additional laser sources 840 and other portions and elements of the laser system 828.

Further, as illustrated, the laser system 828 again includes a beam combiner 841 that combines the beams 856. In FIG. 8, the beam combiner 841 includes a beam director assembly 842 and a beam focus assembly 844 that are similar to the corresponding components described above.

Additionally, as shown, the intermediate wall 874 can include one or more wall apertures 876 (illustrated in phantom) to allow the beams 856 to pass through as the beams 856 are directed from one beam director 860 to another beam director 860. Alternatively, the beams 856 can be directed from one beam director 860 to another beam director 860 in another manner.

Additionally, in this embodiment, the temperature control system 829 includes (i) a heat transferor 846 (illustrated in phantom) that is positioned along the length of the side wall 832 to which the laser sources 840 are adjacent; and (ii) a pair of temperature adjusters 848 positioned within and/or adjacent to each of the laser sources 840. The heat transferor 846 can be positioned along the outer surface 832O of the side wall 832 of the mounting base 826 to which the laser sources 240 are adjacent.

Additionally, in this embodiment, the temperature control system 829 further includes (i) a housing 878 (with two open ends) positioned adjacent to the side wall 832 and substantially encircling the heat transferor 846; and (ii) a fan 880 at one end of the housing 878. The housing 878 provides a conduit through which the fan 880 can direct fluid to promote the removal of the heat from the heat transferor 846.

Figure 9:
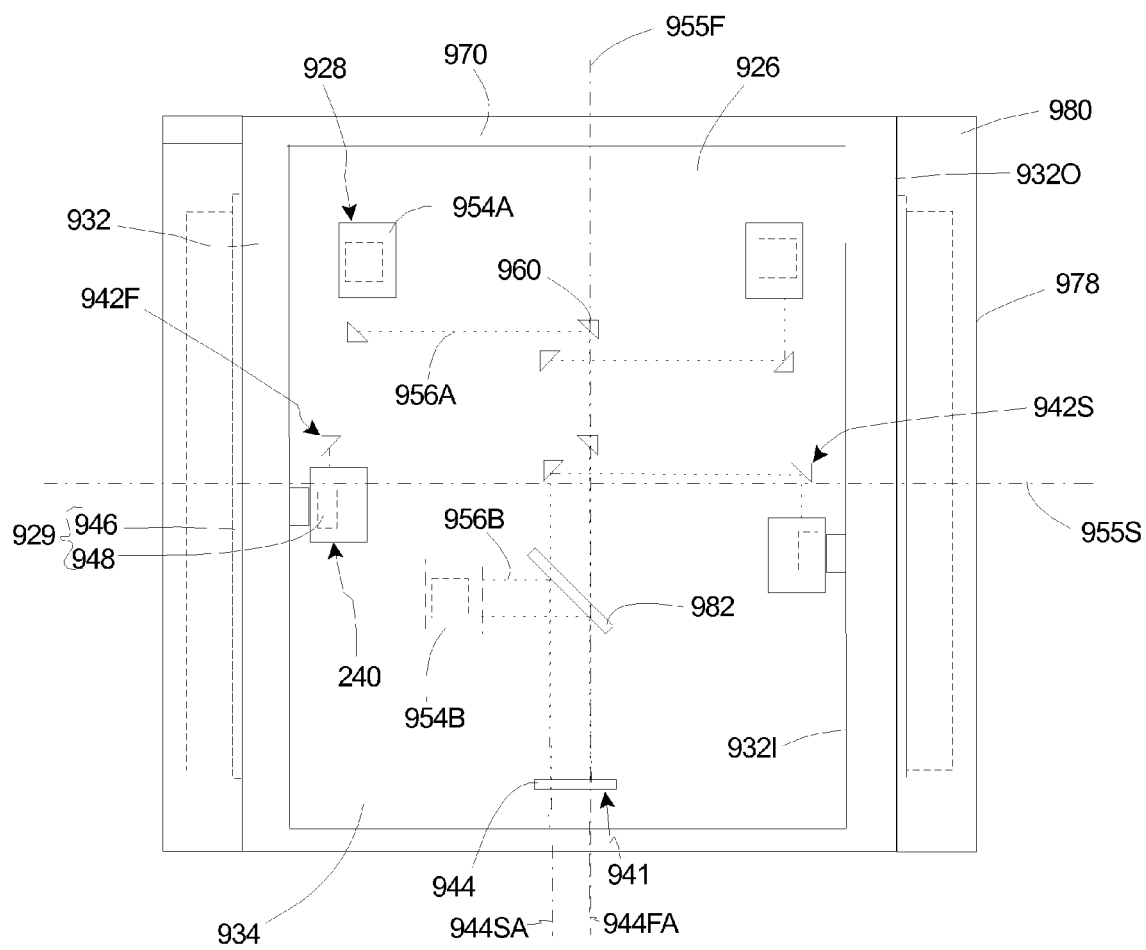
FIG. 9 is a simplified top view of still yet another embodiment of a mounting base, a laser system, and a temperature control system having features of the present invention.

FIG. 9 is a simplified top view of still yet another embodiment of a mounting base 926, a laser system 928, and a temperature control system 929 that are somewhat similar to the corresponding components illustrated and described above. In this embodiment, the mounting base 926 includes (i) a pair of spaced apart, vertical side walls 932 that are substantially parallel to one another, (ii) a pair of spaced apart, vertical end walls 970, and (iii) a base floor 934 that extends substantially horizontally between the middle of the side walls 932 and that extends substantially horizontally between the middle of the end walls 970, the base floor 934 extending substantially perpendicularly relative to each of the side walls 932 and each of the end walls 970. Moreover, in this embodiment, the mounting base 926 includes a generally H shaped cross-section. With this design, the mounting base 926 is again substantially symmetrical about each of a first planar axis 955F, a second planar axis 955S, and a third planar axis (not shown).

Additionally, as shown in FIG. 9, the laser system 928 includes a plurality of laser sources 940 which are fixedly secured to the mounting base 926. In particular, in this embodiment, the laser system 928 includes (i) two MIR laser sources 954A that are fixedly secured to a top surface of the base floor 934 near the side walls 932; (ii) two MIR laser sources 954A that are fixedly secured to the inner surface 932I of the side walls 932, and (iii) one non-MIR laser source 954B (illustrated in phantom) that is fixedly secured to a bottom surface (not shown) of the base floor 934. Alternatively, the laser system 928 can include a different number of MIR laser sources 954A, a different number of non-MIR laser sources 954B, and/or the laser sources 954A, 954B can be positioned in a different manner on the base floor 934.

Further, in this embodiment, the non-MIR laser source 954B generates a beam that is split into two non-MIR beams 956B that are redirected from the bottom surface of the base floor 934 to the top surface of the base floor 934. Alternatively, the laser system 928 can include a pair of non-MIR laser sources 954B that each generates a separate non-MIR beam.

Additionally, as illustrated, the laser system 928 can include a beam combiner 941 having a first beam director assembly 942F, a second beam director assembly 942S, and a beam focus assembly 944 (e.g. one or more lenses). The first beam director assembly 942F includes a plurality of beam directors 960 and a dichroic filter 982. The beam directors 960 direct and steer two of the MIR beams 956A and one of the non-MIR beams 956B at the beam focus assembly 944. The dichroic filter 982 reflects the non-MIR beam 956B while transmitting the MIR beams 956A. Moreover, the beams 956A, 956B are steered to be approximately parallel to and adjacent to a first combiner axis 944FA of the beam focus assembly 944. Somewhat similarly, the second beam director assembly 942S includes a plurality of beam directors 960 and the dichroic filter 982. The beam directors 960 direct and steer two of the MIR beams 956A and one of the non-MIR beams 956B at the beam focus assembly 944. The dichroic filter 982 reflects the non-MIR beam 956B while transmitting the MIR beams 956A. Moreover, the beams 956A, 956B are steered to be approximately parallel to and adjacent to a second combiner axis 944SA of the second beam focus assembly 944S.

Additionally, in this embodiment, the temperature control system 929 includes (i) a pair of heat transferors 946, with one heat transferor 946 being positioned along the length of each of the side walls 932 of the mounting base 926; and (ii) one or more temperature adjusters 948 positioned within and/or adjacent to each of the laser sources 954A, 954B.

In this embodiment, each of the heat transferors 946 can be positioned along an outer surface 932O of one of the side walls 932 of the mounting base 926. Additionally, the heat transferors 946 can extend substantially along the entire length or just a portion of the side walls 932 so as to effectively withdraw heat from each of the laser sources 954A, 954B that are positioned near and/or substantially adjacent to each side wall 932.

Additionally, in this embodiment, the temperature control system 929 further includes a pair of open ended housings 978 positioned adjacent to each of the side walls 932 and substantially about each of the heat transferors 946; and a pair of fans 980, with each fan 980 being positioned at one end of each housing 978. The housing 978 provides a conduit for directing a fluid across the heat transferors 946.

Figure 10:
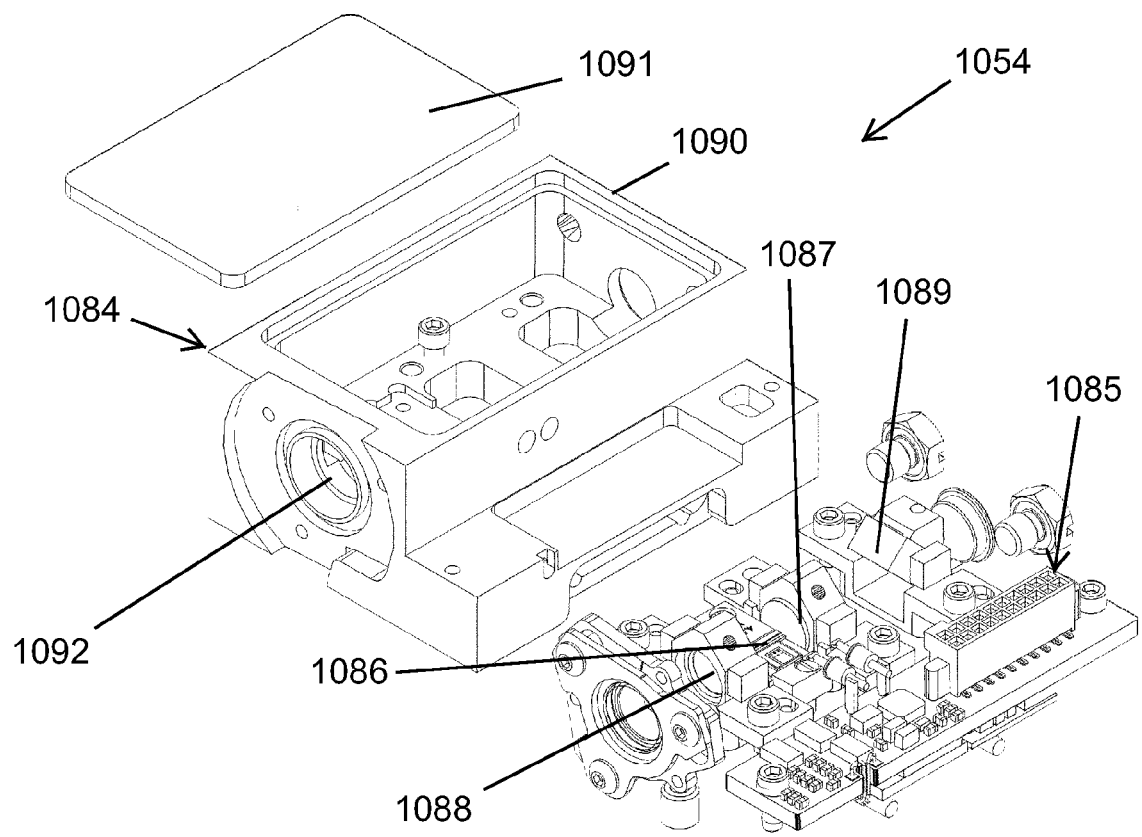
FIG. 10 is a partially exploded perspective view of an embodiment of a laser source usable as part of the present invention.

FIG. 10 is a partially exploded perspective view of an embodiment of a MIR laser source 1054 usable with the laser source assemblies described herein. In this embodiment, the laser source 1054 can include (i) a laser housing 1084, (ii) a circuit board 1085, (iii) a gain medium 1086, (iv) a cavity optical assembly 1086, (v) an output optical assembly 1088, and a wavelength dependent ("WD") feedback assembly 1089. It should be noted that the laser source 1054 can be designed with more or fewer components than described above.

The laser housing 1084 encloses various components of the laser source 1054. In one non-exclusive embodiment, the laser housing 1084 is rigid, generally hollow rectangular box shaped, and defines a housing chamber that can be sealed and/or that can provide a controlled environment for various components of the laser source 1054. For example, the laser housing 1084 can be filled with an inert gas, or another type of fluid, or the laser housing 1084 can be subjected to vacuum. Additionally, the laser housing 1084 can include a housing body 1090, a removable housing top 1091 that provides access to the various components of the laser source 1054 enclosed in the laser housing 1084, and a transparent window 1092 that allows the assembly output beam 12 (illustrated in FIG. 1) to exit the laser housing 1084.

In this embodiment, the laser source 1054 is an external cavity (EC), narrow linewidth, quantum cascade laser (QCL) that is packaged within the laser housing 1084. With this design, the assembly output beam 12 can be characterized by near-diffraction limited divergence, narrow linewidth and specific wavelength in the MIR spectral range. Further, the EC-QLC provides stable, predictable spectral emission that does not change over time and does not change due to variations in temperature.

In particular, in this embodiment, the gain medium 1086, the cavity optical assembly 1087, the output optical assembly 1088, and the feedback assembly 1089 are positioned within the laser housing 1084.

In one embodiment, the gain medium 1086 is a Quantum Cascade ("QC") gain medium that generates a laser beam that is in the mid-infrared range. In one embodiment, the QC gain medium 1086 includes (i) a first facet that faces the cavity optical assembly 1087 and the WD feedback assembly 1089, and (ii) a second facet that faces the output optical assembly 1088. In this embodiment, the QC gain medium 1086 emits from both facets.

The cavity optical assembly 1087 is positioned between the QC gain medium 1086 and the WD feedback assembly 1089 along the lasing axis, and collimates and focuses the light that passes between these components. In certain embodiments, the cavity optical assembly 1087 can include one lens or more than one lens. For example, in one embodiment, the cavity optical assembly 1087 can include an aspherical lens having an optical axis that is aligned with the lasing axis. Moreover, in some embodiments, to achieve the desired small size and portability, the lens has a relatively small diameter.

The output optical assembly 1088 is positioned between the QC gain medium 1086 and the window 1092 in line with the lasing axis. Additionally, the output optical assembly 1088 collimates and focuses the light that exits the second facet of the QC gain medium 1086. For example, in certain embodiments, the output optical assembly 1088 can include one lens or more than one lens that can be somewhat similar in design to the lens or lenses of the cavity optical assembly 1087.

The WD feedback assembly 1089 reflects light back to the QC gain medium 1086 along the lasing axis, and is used to precisely adjust the lasing frequency of the external cavity and the wavelength of the beam. In this manner, the assembly output beam 12 may be tuned and set to a desired fixed wavelength with the WD feedback assembly 1089 without adjusting the QC gain medium 1086. Thus, in the external cavity arrangements disclosed herein, the WD feedback assembly 1089 dictates what wavelength will experience the most gain and thus dominate the wavelength of the assembly output beam 12.

In certain embodiments, the WD feedback assembly 1089 includes a wavelength dependent ("WD") reflector that cooperates with the reflective coating on the second facet of the QC gain medium 1086 to form the external cavity. The design of the WD feedback assembly 1089 and the WD reflector can vary pursuant to the teachings provided herein. Non-exclusive examples of suitable designs include a diffraction grating, a MEMS grating, prism pairs, a thin film filter stack with a reflector, an acoustic optic modulator, or an electro-optic modulator. A more complete discussion of these types of WD reflectors can be found in the Tunable Laser Handbook, Academic Press, Inc., Copyright 1995, chapter 8, Pages 349-435, Paul Zorabedian.

Figure 11:
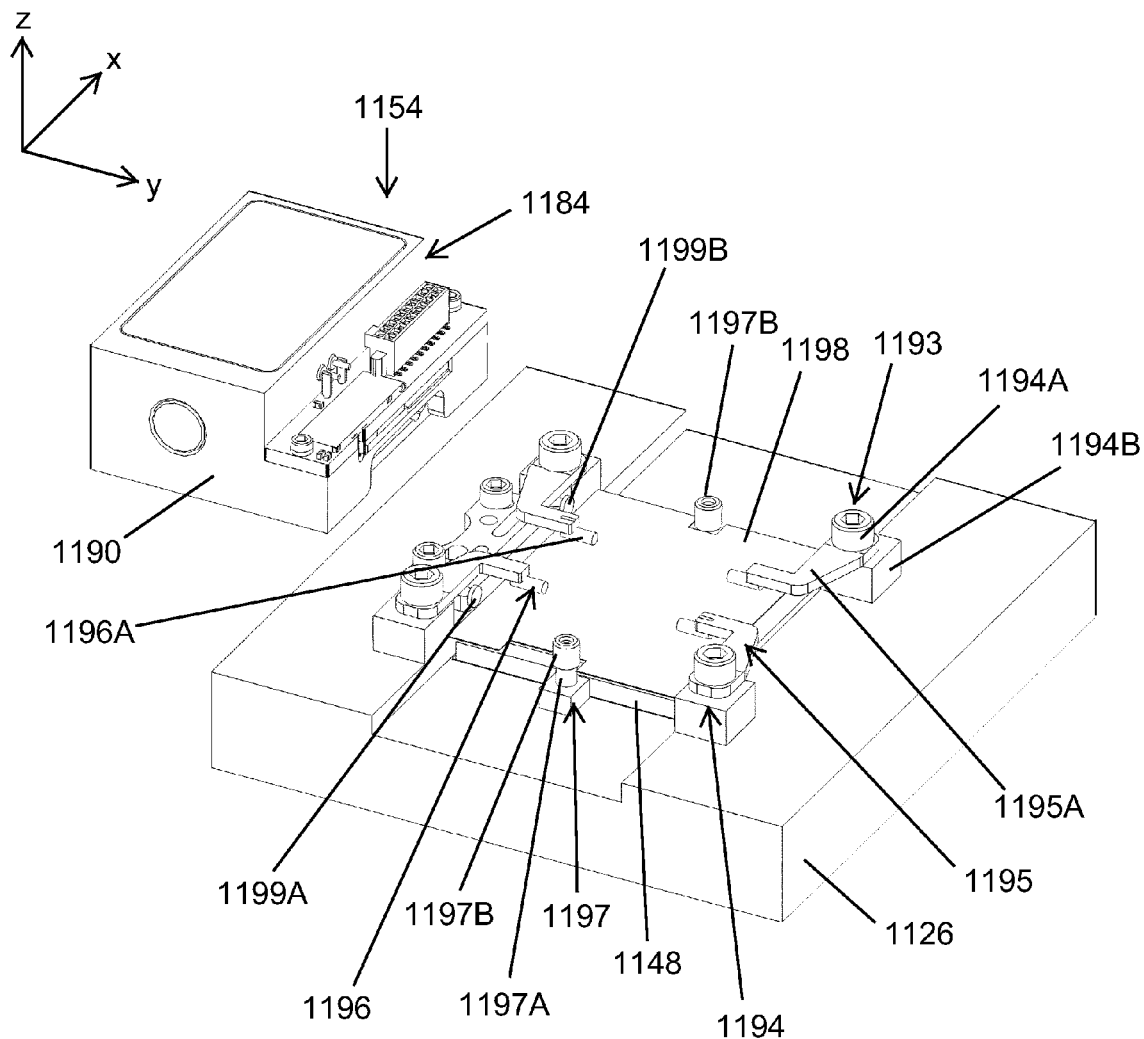
FIG. 11 is a partially exploded perspective view of a portion of a mounting base and another embodiment of a laser source usable as part of the present invention.

FIG. 11 is a partially exploded perspective view of a portion of a mounting base 1126 and another embodiment of a laser source 1154 usable as part of the present invention. More particularly, FIG. 11 illustrates that the laser source 1154 includes a laser housing 1184, a temperature adjuster 1148, and a mounting assembly 1193 that resiliently urges the laser housing 1184 and the temperature adjuster 1148 against the mounting base 1126.

In certain embodiments, the mounting assembly 1193 secures the laser housing 1184 to the mounting base 1126 so as to allow the laser housing 1184 to expand and contract relative to the temperature adjuster 1148 and/or the mounting base 1126 (due to changes in temperature), while not distorting the laser housing 1184 and the gain medium 1086 (illustrated in FIG. 10), and while maintaining alignment of the assembly output beam 12 (illustrated in FIG. 1). Further, in certain embodiments, the mounting assembly 1193 is designed so that the mounting assembly 1193 does not thermally and electrically connect the gain medium 1086 to the mounting base 1126.

The design of the mounting assembly 1193 can be varied to suit the specific requirements of the laser source 1154 and the mounting base 1126. In one embodiment, the mounting assembly 1193 includes a fastener assembly 1194, a mounting resilient assembly 1195, a rod assembly 1196, and an alignment assembly 1197.

In one non-exclusive embodiment, (i) the fastener assembly 1194 includes four frame fasteners 1194A, e.g., threaded bolts, with each fastener 1194A fitting through a corresponding spacer 1194B and threaded into a corresponding internally threaded aperture (not shown) in the mounting base 1126; (ii) the mounting resilient assembly 1195 includes four resilient members 1195A (e.g., spring steel beams); and (iii) the rod assembly 1196 includes for four engagement rods 1196A positioned in the grooves (not shown) in the housing body 1190 of the laser housing 1184. Alternatively, the mounting assembly 1193 can be designed to include fewer than or greater than four fasteners 1194A, fewer than or greater than four resilient members 1195A, and/or fewer than or greater than four engagement rods 1196A.

The fasteners 1194A, the resilient members 1195A, and the engagement rods 1196A cooperate to resiliently urge the laser housing 1184 towards the mounting base 1126 with the temperature adjuster 1148 positioned between. In this embodiment, each resilient member 1195A includes a proximal end and a distal end. Further, each fastener 1194A extends through an aperture (not shown) in the proximal end of one of the resilient members 1195A and is threaded into the mounting base 1126. Further, the distal end of each resilient member 1195A urges a corresponding one of the engagement rods 1196A against the laser housing 1184, i.e. into the grooves in the housing body 1190.

With this design, (i) the flexing characteristics of the resilient members 1195A can be tuned to specifically control the amount of force that is applied to mechanically hold the laser housing 1184 against the temperature adjuster 1148 and the mounting base 1126; (ii) the resilient members 1195A provide a substantially uniform, non-bending pressure on the laser housing 1184 and the temperature adjuster 1148; (iii) the pressure is applied by the resilient members 1195A to the laser housing 1184 so as to minimize the likelihood of bending the laser housing 1184; (iv) an interface between resilient members 1195A and the engagement rods 1196A forms a line contact between the rods 1196A and the resilient members 1195A that minimizes the amount of heat transferred; (v) the rods 1196A can be made of electrically insulating sapphire (or another electrically insulating material) to provide electrical isolation between the laser housing 1184 and the mounting base 1126; (iv) the arrangement of the engagement rods 1196A allows the laser housing 1184 to expand or contract along the horizontal (X and Y) axes relative to the mounting base 1126, while urging the laser housing 1184 against the temperature adjuster 1148.

In this embodiment, the alignment assembly 1197 maintains alignment of a portion of the laser source 1154 along the X axis. In one embodiment, the alignment assembly 1197 includes (i) a pair of alignment pins 1197A that are secured to the mounting base 1126 and that are spaced apart along the X axis; (ii) a pair of annular shaped housing bushings 1197B; and (ii) an alignment resilient assembly (not shown) that resiliently urges the laser housing 1184 along the Y axis against the alignment pins 1197A. In this embodiment, each housing bushing 1197B fits into a corresponding housing aperture (not shown) in the laser housing 1184. Further, each housing bushing 1197B can be fixedly secured to the laser housing 1184 with an adhesive or a compression fit, as non-exclusive examples. In one embodiment, each housing bushing 1197B is made an electrically insulating material to electrically isolate the alignment assembly 1197.

With this design, each alignment pin 1197A fits into a corresponding housing bushing 1197B (aligned and spaced apart along the X axis) in the laser housing 1184. In certain embodiments, each housing bushing 1197B is larger in diameter than the cross-section of the corresponding alignment pin 1197A. Further, for example, each alignment pin 1197A has a non-circular shaped cross-section, e.g. a "D" shaped, square shaped, diamond shaped, octagon shaped, or hexagon shaped cross-section. With this design, when the alignment resilient assembly urges the housing bushings 1197B in the laser housing 1184 along the Y axis against the alignment pins 1197A, each alignment pin 1197A has two spaced apart points of contact with the laser housing 1184. This will provide better alignment of the laser housing 1184 along the X axis.

Additionally, in one embodiment, a conductor material 1198, e.g., a pyrolytic graphite sheet, can be positioned substantially between the laser housing 1184 and the temperature adjuster 1148 and/or between the temperature adjuster 1148 and the mounting base 1126.

Additionally, FIG. 11 illustrates a pair of spaced apart, electrically isolating pads 1199A, 1199B. For example, the pads 1199A, 1199B can be made of sapphire. In certain embodiments, the pads 1199A, 1199B are fixedly secured to the laser housing 1184. As a non-exclusive example, the pads 1199A, 1199B can be secured to the laser housing 1184 with an adhesive.

While a number of exemplary aspects and embodiments of a laser source assembly 10 have been discussed above, those of skill in the art will recognize certain modifications, permutations, additions and sub-combinations thereof. It is therefore intended that any claims that may be hereafter introduced with regard to the present invention are interpreted to include all such modifications, permutations, additions and sub-combinations as are within their true spirit and scope.

What is claimed is:

1. A laser source assembly comprising:
   a first laser source that generates a first beam;
   a redirector assembly that redirects the first beam;
   a mounting base that supports the first laser source, the mounting base including (i) a first side wall having a first side top and a first side bottom, a first inner surface, and a first outer surface, and (ii) a base floor that extends away from the first inner surface of the first side wall between the first side top and the first side bottom, the base floor retaining at least a portion of the redirector assembly and being perpendicular to the first side wall; wherein the first laser source is secured to the first inner surface of the first side wall; and
   a temperature control system that controls the temperature of one or more of the first laser source and the mounting base, the temperature control system including a first heat transferor that is positioned substantially adjacent to the first side outer surface of the first side wall opposite the first laser source, wherein heat generated by the first laser source is transferred through the first side wall to the first heat transferor and away from the base floor.

2. The laser source assembly of claim 1 wherein the mounting base further includes a second side wall having a second side top, a second side bottom and a second inner surface, the base floor extending away from the second inner surface of the second side wall between the second side top and the second side bottom, and the base floor extending between the first side wall and the second side wall; wherein the second side wall is parallel to the first side wall.

3. The laser source assembly of claim 2 wherein the base floor extends between approximately a center of the first inner surface of the first side wall and approximately a center of the second inner surface of the second side wall, the mounting base being substantially symmetrical about each of a first planar axis, a second planar axis that is orthogonal to the first planar axis, and a third planar axis that is orthogonal to the first planar axis and the second planar axis.

4. The laser source assembly of claim 3 wherein the mounting base is includes a substantially H-shaped cross-section.

5. The laser source assembly of claim 1 wherein the mounting base further includes a first floor aperture that extends through the base floor, and wherein the first laser source is positioned within the first floor aperture against the first inner surface of the first side wall.

6. The laser source assembly of claim 1 further comprising a second laser source that generates a second beam, and wherein the first beam and the second beam are combined to create an assembly output beam.

7. The laser source assembly of claim 6 wherein the mounting base further includes a second side wall that is parallel to the first side wall, the base floor extending between the first inner surface of the first side wall and the second inner surface of the second side wall, wherein the first laser source is positioned adjacent to the first inner surface of the first side wall, and wherein the second laser source is positioned adjacent to one of the first inner surface of the first side wall and the second inner surface of the second side wall.

8. The laser source assembly of claim 7 wherein heat generated by the second laser source is transferred away from the base floor and through one of the first side wall and the second side wall.

9. The laser source assembly of claim 1 wherein the temperature control system further includes a first temperature adjuster that is positioned within the first laser source, and a second temperature adjuster that is positioned substantially between the first laser source and the first side wall.

10. The laser source assembly of claim 1 wherein the first laser source is a mid-infrared laser source.

11. A laser source assembly comprising:
    a first laser source that generates a first beam;
    a redirector assembly that redirects the first beam; and
    a mounting base that supports the first laser source, the mounting base including (i) a first side wall having a first side top, a first side bottom and a first side inner surface, (ii) a second side wall having a second side top, a second side bottom and a second inner surface, the second side wall being parallel to the first side wall, and (iii) a base floor that extends between the first inner surface of the first side wall and the second inner surface of the second side wall, the base floor extending away from the first inner surface of the first side wall between the first side top and the first side bottom, and the base floor extending away from the second inner surface of the second side wall between the second side top and the second side bottom, the base floor retaining at least a portion of the redirector assembly, the base floor being perpendicular to the first side wall and the second side wall; wherein the first laser source is secured to the first inner surface of the first side wall adjacent to the base floor.

12. The laser source assembly of claim 11 wherein the mounting base is substantially symmetrical about each of a first planar axis, a second planar axis that is orthogonal to the first planar axis, and a third planar axis that is orthogonal to the first planar axis and the second planar axis.

13. The laser source assembly of claim 12 wherein the mounting base includes a substantially H-shaped cross-section.

14. The laser source assembly of claim 11 further comprising a redirector assembly that redirects the first beam, wherein at least a portion of the redirector assembly is secured to the base floor.

15. The laser source assembly of claim 11 further comprising a temperature control system that controls the temperature of the first laser source, the temperature control system including a first heat transferor that is positioned substantially adjacent to an outer surface of the first side wall opposite the first laser source, wherein heat generated by the first laser source is transferred through the first side wall to the first heat transferor and away from the base floor.

16. The laser source assembly of claim 15 further comprising a second laser source that generates a second beam, and wherein the first beam and the second beam are combined to create an assembly output beam.

17. The laser source assembly of claim 16 wherein the first laser source is positioned adjacent to the first inner surface of the first side wall and the second laser source is positioned adjacent to one of the first inner surface of the first side wall and the second inner surface of the second side wall, and wherein heat generated by the second laser source is transferred through one of the first side wall and the second side wall and away from the base floor.

18. The laser source assembly of claim 11 wherein the base floor includes a first floor aperture, and wherein at least a portion of the first laser source is positioned within the first floor aperture against the first inner surface of the first side wall.

19. The laser source assembly of claim 11 further comprising a temperature control system that controls the temperature of the first laser source, the temperature control system including a first temperature adjuster that is positioned within the first laser source, and a second temperature adjuster that is positioned substantially between the first laser source and the first side wall.

20. The laser source assembly of claim 11 wherein the first laser source is a mid-infrared laser source.

21. A laser source assembly comprising:
a first laser source that generates a first beam;
a second laser source that generates a second beam;
a beam combiner that combines the first beam and the second beam to create an assembly output beam, the beam combiner including a redirector assembly that redirects the first beam and the second beam;
a mounting base that supports the first laser source and the second laser source, the mounting base having a substantially H-shaped cross-section including (i) a first side wall having a first side top, a first side bottom, a first side inner surface, and a first side outer surface, (ii) a second side wall having a second side top, a second side bottom, a second inner surface, and a second side outer surface, the second side wall being parallel to the first side wall, and (iii) a base floor that extends between the first inner surface of the first side wall and the second inner surface of the second side wall, the base floor extending away from approximately a center of the first inner surface of the first side wall between the first side top and the first side bottom, and the base floor extending away from approximately a center of the second inner surface of the second side wall between the second side top and the second side bottom, the base floor retaining at least a portion of the redirector assembly, the base floor being perpendicular to the first side wall and the second side wall; wherein the first laser source is secured to the first inner surface of the first side wall; and wherein the second laser source is secured to one of the first inner surface of the first side wall and the second inner surface of the second side wall; and a temperature control system that controls the temperature of one or more of the first laser source, the second laser source and the mounting base, the temperature control system including (i) a first heat transferor that is positioned substantially adjacent to the first side outer surface opposite the first laser source, wherein heat generated by the first laser source is transferred through the first side wall to the first heat transferor and away from the base floor; (ii) a second heat transferor that is positioned substantially adjacent to one of the first side outer surface and the second side outer surface opposite the second laser source, wherein heat generated by the second laser source is transferred through one of the first side wall and the second side wall to the second heat transferor and away from the base floor; (iii) a first temperature adjuster that is positioned within the first laser source, and (iv) a second temperature adjuster that is positioned substantially between the first laser source and the first side wall.

22. The laser source assembly of claim 21 further comprising a top cover that is positioned adjacent to the first side top and the second side top to create a sealed upper chamber, and a bottom cover that is positioned adjacent to the first side bottom and the second side bottom to create a sealed lower chamber; and wherein a change in ambient pressure about the laser source assembly generates a first pressure on the top cover and generates a second pressure on the bottom cover, the second pressure being substantially equal and opposite to the first pressure.

23. The laser source assembly of claim 3 further comprising a top cover that is positioned adjacent to the first side top and the second side top to create a sealed upper chamber, and a bottom cover that is positioned adjacent to the first side bottom and the second side bottom to create a sealed lower chamber; and wherein a change in ambient pressure about the laser source assembly generates a first pressure on the top cover and generates a second pressure on the bottom cover, the second pressure being substantially equal and opposite to the first pressure.

24. The laser source assembly of claim 12 further comprising a top cover that is positioned adjacent to the first side top and the second side top to create a sealed upper chamber, and a bottom cover that is positioned adjacent to the first side bottom and the second side bottom to create a sealed lower chamber; and wherein a change in ambient pressure about the laser source assembly generates a first pressure on the top cover and generates a second pressure on the bottom cover, the second pressure being substantially equal and opposite to the first pressure.

* * * * *